(12) United States Patent
Hsu et al.

(10) Patent No.: US 12,057,347 B2
(45) Date of Patent: Aug. 6, 2024

(54) MANUFACTURING METHOD OF ACTIVE DEVICE SUBSTRATE

(71) Applicant: Au Optronics Corporation, Hsinchu (TW)

(72) Inventors: Yi-Yueh Hsu, Hsinchu (TW); Kuan-Hsun Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 461 days.

(21) Appl. No.: 17/519,543

(22) Filed: Nov. 4, 2021

(65) Prior Publication Data

US 2023/0097567 A1 Mar. 30, 2023

(30) Foreign Application Priority Data

Sep. 27, 2021 (TW) .................................. 110135908

(51) Int. Cl.
*H01L 21/768* (2006.01)
*H01L 23/522* (2006.01)
*H05K 1/11* (2006.01)

(52) U.S. Cl.
CPC .. *H01L 21/76841* (2013.01); *H01L 21/76802* (2013.01); *H01L 21/76877* (2013.01); *H01L 23/5226* (2013.01); *H05K 1/115* (2013.01); *H05K 1/118* (2013.01)

(58) Field of Classification Search
CPC ......... H01L 21/76841; H01L 21/76802; H01L 21/76877; H01L 23/5226; H01L 27/1218; H01L 23/481; H01L 27/124; H01L 27/1259; H01L 27/156; H05K 1/115; H05K 1/118
See application file for complete search history.

(56) References Cited

U.S. PATENT DOCUMENTS

| 9,723,724 | B2 | 8/2017 | Mitarai et al. |
| 10,276,368 | B2 | 4/2019 | Tsunetomo et al. |
| 10,410,884 | B2 | 9/2019 | Mitarai et al. |
| 10,727,048 | B2 | 7/2020 | Tsunetomo et al. |

(Continued)

FOREIGN PATENT DOCUMENTS

| CN | 104299916 | 1/2015 |
| CN | 109524421 | 3/2019 |

(Continued)

*Primary Examiner* — Karen Kusumakar
(74) *Attorney, Agent, or Firm* — JCIPRNET

(57) ABSTRACT

Provided is a manufacturing method of an active device substrate including the following steps. A blind hole is formed in a substrate. A first conductive pattern and an active device are formed on a first surface of the substrate, where the first conductive pattern overlaps the blind hole. After the first conductive pattern and the active device are formed, an etching process is executed on the substrate to form a through hole penetrating the substrate at the position of the blind hole. A conductive material is filled into the through hole to form a conductive hole. The conductive hole is electrically connected to the first conductive pattern. A second conductive pattern is formed on a second surface of the substrate, where the second conductive pattern is electrically connected to the first conductive pattern through the conductive hole.

16 Claims, 24 Drawing Sheets

(56) References Cited

U.S. PATENT DOCUMENTS

| | | | |
|---|---|---|---|
| 2012/0228778 A1* | 9/2012 | Kosenko | H01L 23/49822 |
| | | | 438/668 |
| 2015/0021081 A1 | 1/2015 | Mitarai et al. | |
| 2017/0301558 A1 | 10/2017 | Mitarai et al. | |
| 2017/0358447 A1 | 12/2017 | Tsunetomo et al. | |
| 2019/0088598 A1* | 3/2019 | Gudeman | H01L 23/535 |
| 2019/0148142 A1 | 5/2019 | Tsunetomo et al. | |
| 2020/0303188 A1 | 9/2020 | Tsunetomo et al. | |
| 2022/0399250 A1* | 12/2022 | Chen | H01L 23/481 |
| 2023/0108673 A1* | 4/2023 | Zhang | H10K 59/65 |
| | | | 257/40 |

FOREIGN PATENT DOCUMENTS

| | | |
|---|---|---|
| TW | 201625501 | 7/2016 |
| TW | 202125769 | 7/2021 |

* cited by examiner

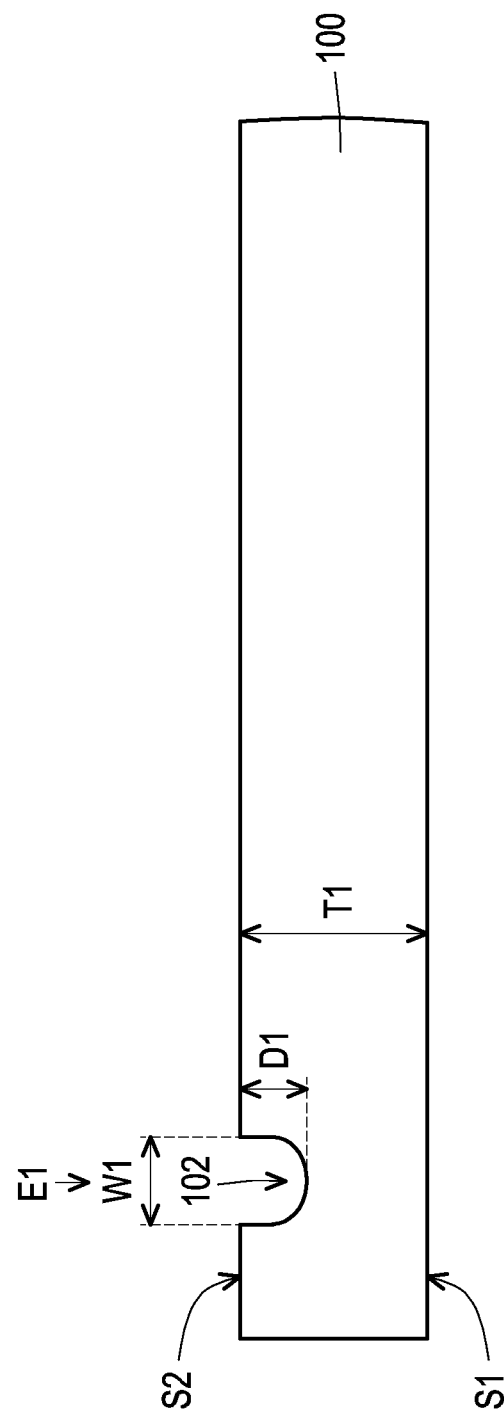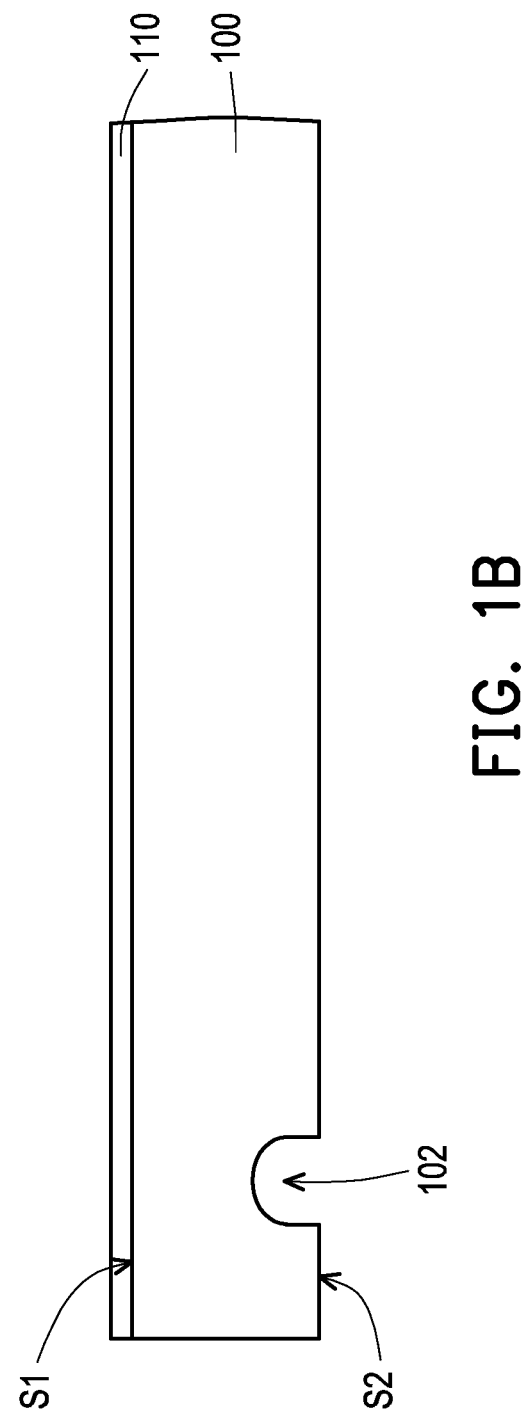
FIG. 1A
FIG. 1B

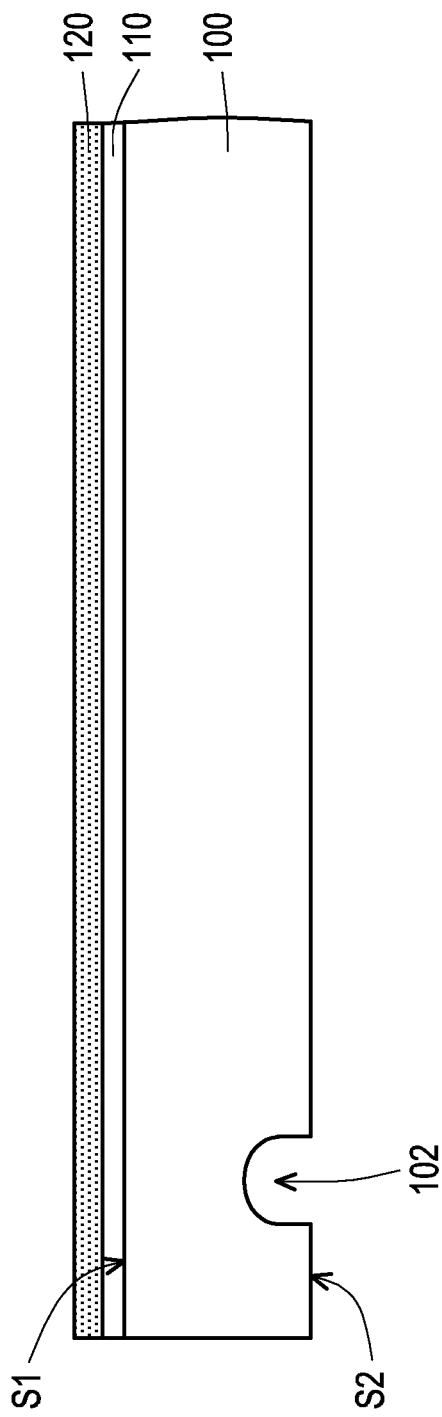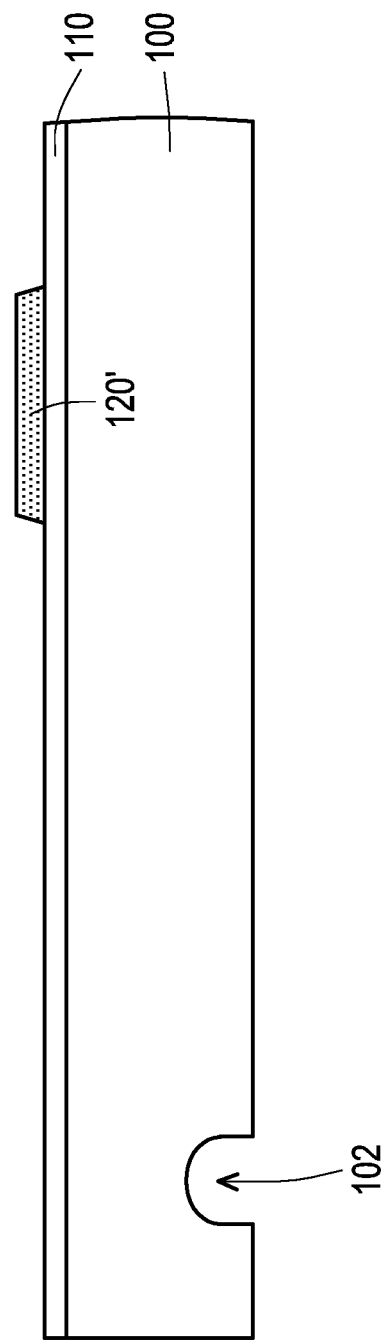

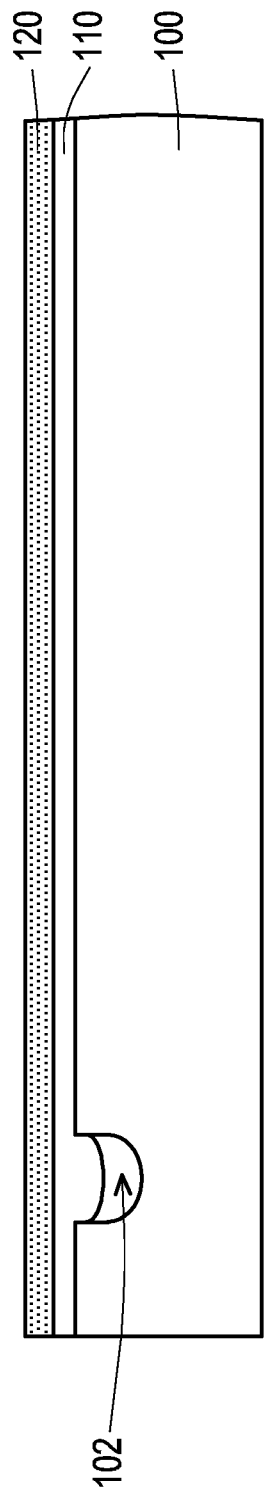
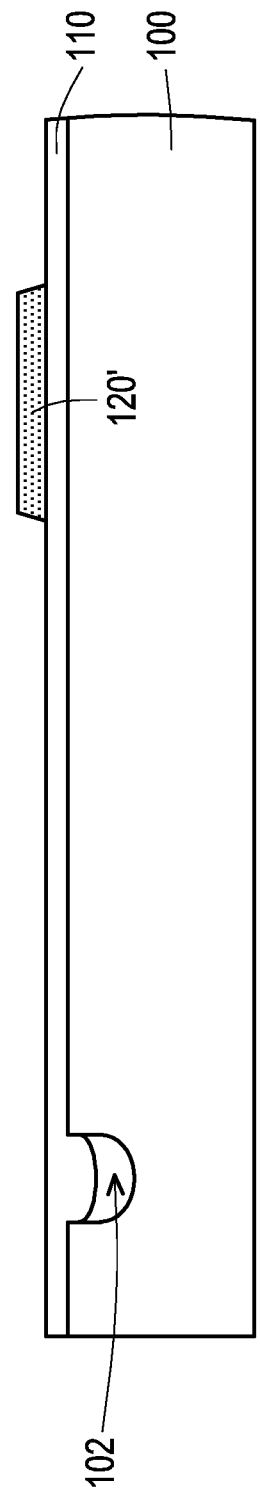
FIG. 3C
FIG. 3D

MANUFACTURING METHOD OF ACTIVE DEVICE SUBSTRATE

CROSS-REFERENCE TO RELATED APPLICATION

This application claims the priority benefit of Taiwan application serial no. 110135908, filed on Sep. 27, 2021. The entirety of the above-mentioned patent application is hereby incorporated by reference herein and made a part of this specification.

BACKGROUND

Technical Field

The disclosure relates to a manufacturing method of an active device substrate, and more particularly to a manufacturing method of an active device substrate having a through hole in a substrate.

Description of Related Art

At present, chip on film (COF) packaging technology is usually used for reducing the frame size of a display panel. The COF packaging technology packages a chip on a flexible printed circuit board. The flexible printed circuit board may be bent from the front of the display panel to the back of the display panel, thereby allowing the chip to be disposed on the back of the display panel. Therefore, the display panel may have the advantage of a narrow frame. However, even if the flexible printed circuit board is bent from the front of the display panel to the back of the display panel, the flexible printed circuit board still protrudes from a lateral surface of a glass substrate of the display panel.

SUMMARY

The disclosure provides a manufacturing method of an active device substrate, which may better handle the problem of conductive hole expansion of substrates.

At least one embodiment of the disclosure provides a manufacturing method of an active device substrate, including the following steps. A blind hole is formed in a substrate. A first conductive pattern and an active device are formed on a first surface of the substrate, where the first conductive pattern overlaps the blind hole. After the first conductive pattern and the active device are formed, an etching process is executed on the substrate to form a through hole penetrating the substrate at the position of the blind hole. A conductive material is filled into the through hole to form a conductive hole. The conductive hole is electrically connected to the first conductive pattern. A second conductive pattern is formed on a second surface of the substrate, where the second conductive pattern is electrically connected to the first conductive pattern through the conductive hole.

Based on the above, the conductive hole is formed after the active device is formed. Therefore, impacts of the process of manufacturing the active device upon the conductive hole may be avoided, and the problem of the substrate damaged due to conductive hole deformation may be better handled.

BRIEF DESCRIPTION OF THE DRAWINGS

FIG. 1A to FIG. 1L are schematic cross-sectional views of a manufacturing method of an active device substrate according to an embodiment of the disclosure.

FIG. 3A to FIG. 3H are schematic cross-sectional views of a manufacturing method of an active device substrate according to an embodiment of the disclosure.

DESCRIPTION OF THE EMBODIMENTS

FIG. 1A to FIG. 1L are schematic cross-sectional views of a manufacturing method of an active device substrate according to an embodiment of the disclosure.

With reference to FIG. 1A, an etching process E1 is executed to form a blind hole 102 in a substrate 100. In this embodiment, the substrate 100 includes a first surface S1 and a second surface S2 opposite to the first surface S1, and the blind hole 102 is formed on the second surface S2 of the substrate 100. The blind hole 102 does not penetrate the substrate 100.

In some embodiments, the substrate 100 includes glass, quartz, organic polymer, or other applicable materials, and the method for forming the blind hole 102 on the substrate 100 includes laser or other suitable methods.

In some embodiments, a thickness T1 of the substrate 100 is 100 micrometers to 600 micrometers, a depth D1 of the blind hole 102 is more than half the thickness of the substrate, and a width W1 of the blind hole 102 is 10 micrometers to 300 micrometers.

With reference to FIG. 1B, a first buffer layer 110 is formed on the first surface S1 of the substrate 100. In some embodiments, after the blind hole 102 is formed, the substrate 100 is flipped over, and then the first buffer layer 110 is formed on the first surface S1 of the substrate 100. In this embodiment, the first buffer layer 110 covers the first surface S1 of the substrate 100, and the first buffer layer 110 overlaps the blind hole 102. In some embodiments, the material of the first buffer layer 110 includes silicon oxide, silicon nitride, silicon oxynitride, organic materials, or other suitable materials.

Figure 1E:
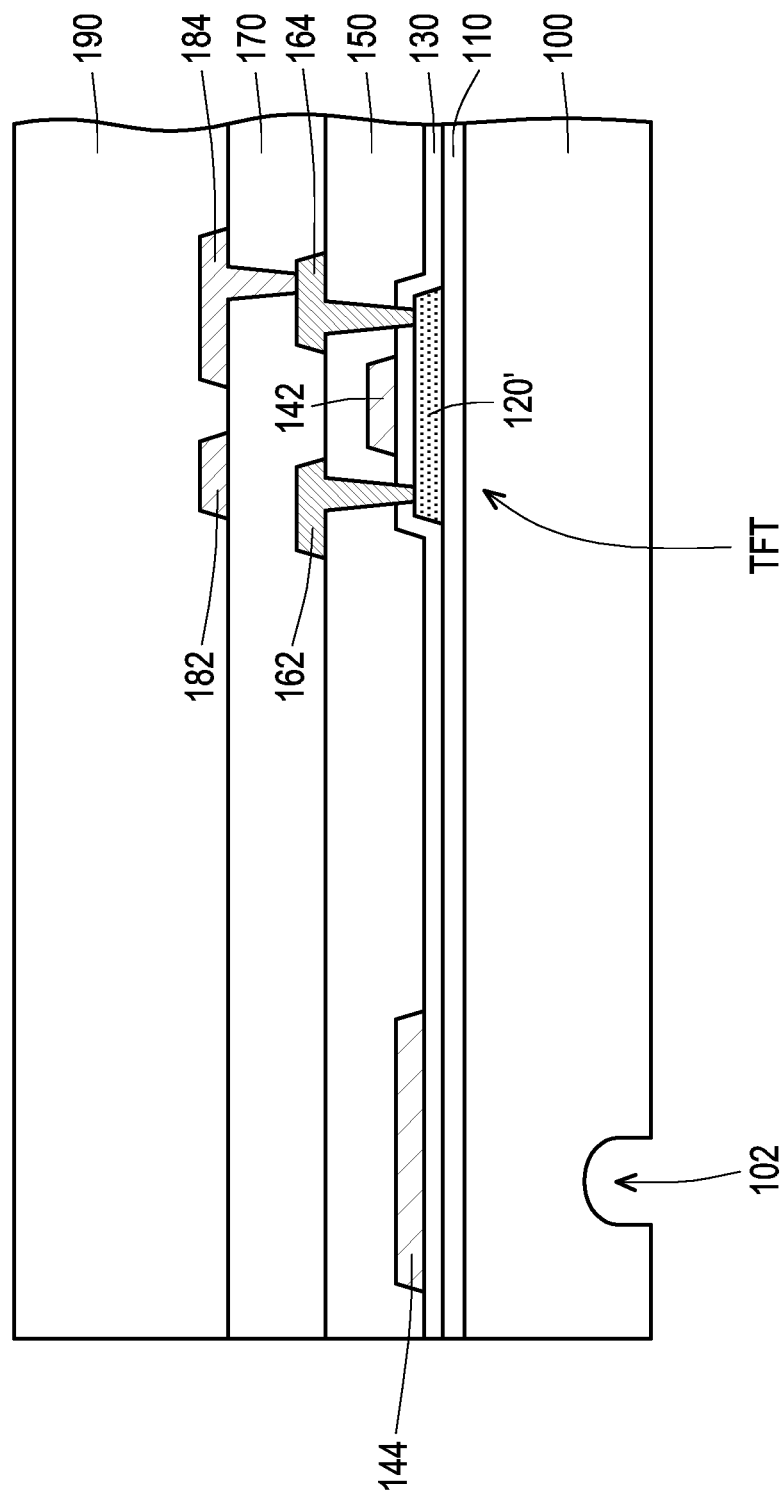

With reference to FIG. 1C to FIG. 1E, after the blind hole 102 is formed, a first conductive pattern 144 and an active device TFT are formed on the first surface S1 of the substrate 100. In this embodiment, the first conductive pattern 144 and the active device TFT are formed on the first buffer layer 110.

With reference to FIG. 1C, a semiconductor material layer 120 is formed on the first surface S1 of the substrate 100.

With reference to FIG. 1D, the semiconductor material layer 120 is patterned to form a semiconductor channel layer 120' on the first surface S1 of the substrate 100. In some embodiments, the semiconductor channel layer 120' includes, for example, amorphous silicon, polycrystalline silicon, microcrystalline silicon, monocrystalline silicon, organic semiconductor materials, oxide semiconductor materials (such as indium zinc oxide, indium gallium zinc oxide, other suitable materials, or a combination of the above), other suitable materials, or a combination of the above materials.

With reference to FIG. 1E, a gate insulating layer 130 is formed on the semiconductor channel layer 120'. In this embodiment, the gate insulating layer 130 entirely covers the first buffer layer 110 and overlaps the blind hole 102, but the disclosure is not limited thereto. In other embodiments, the gate insulating layer 130 is patterned and does not overlap the blind hole 102.

A gate 142 and the first conductive pattern 144 are formed on the gate insulating layer 130. The gate 142 overlaps the semiconductor channel layer 120'. The first conductive pattern 144 overlaps the blind hole 102. In some embodiments, the gate 142 and the first conductive pattern 144 belong to the same conductive layer and are formed through the same patterning process.

In some embodiments, the gate 142 and the first conductive pattern 144 respectively include a monolayer or multilayer structure. The gate 142 and the first conductive pattern 144 are, for example, metals such as chromium, gold, silver, copper, tin, lead, hafnium, tungsten, molybdenum, neodymium, titanium, tantalum, aluminum, zinc, alloy of the above metals, oxide of the above metals, nitride of the above metals, a combination of the above, or other conductive materials.

A dielectric layer 150 is formed on the gate 142 and the first conductive pattern 144. A source 162 and a drain 164 are formed on the dielectric layer 150. The source 162 and the drain 164 are electrically connected to the semiconductor channel layer 120'. By this time, the active device TFT is substantially completed. In this embodiment, the active device TFT includes the semiconductor channel layer 120', the gate 142, the source 162, and the drain 164. The first conductive pattern 144 is selectively electrically connected to the active device TFT. For example, the first conductive pattern 144 is electrically connected to the gate 142 or the source 162 of the active device TFT, but the disclosure is not limited thereto.

In this embodiment, the active device TFT takes a top-gate thin-film transistor as an example, but the disclosure is not limited thereto. In other embodiments, the active device TFT is a bottom-gate thin-film transistor, a dual-gate thin-film transistor, or other types of thin-film transistors.

In some embodiments, the semiconductor channel layer 120' of the active device TFT includes low temperature polycrystalline silicon, and the method for forming the active device TFT includes a process in a temperature of 200 degrees Celsius to 600 degrees Celsius, but the disclosure is not limited thereto.

A flatten layer 170 is formed on the active device TFT and the dielectric layer 150. A first pad 182 and a second pad 184 are formed on the flatten layer 170. In this embodiment, the second pad 184 is electrically connected to the drain 164 of the active device TFT.

A protection layer 190 is formed on the flatten layer 170, the first pad 182, and the second pad 184. In some embodiments, the protection layer 190 is a removable adhesive or a passivation layer.

Figure 1F:
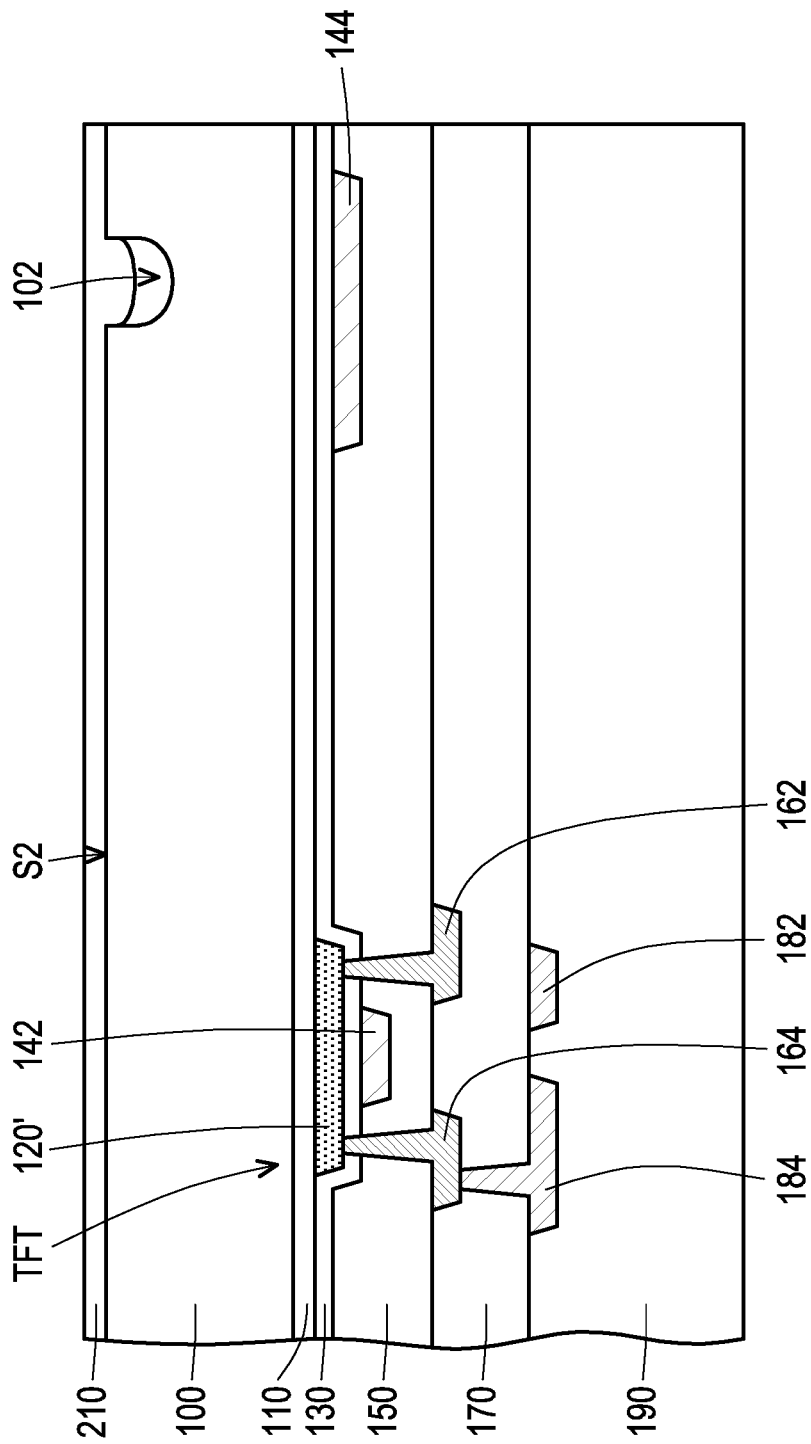

With reference to FIG. 1F, the substrate 100 is flipped over. A second buffer layer 210 is formed on the second surface S2 of the substrate 100. The second buffer layer 210 covers the blind hole 102. In some embodiments, the second buffer layer 210 is partially filled into the blind hole 102. In some embodiments, the material of the second buffer layer 210 includes silicon oxide, silicon nitride, silicon oxynitride, organic materials, or other suitable materials.

Figure 1G:
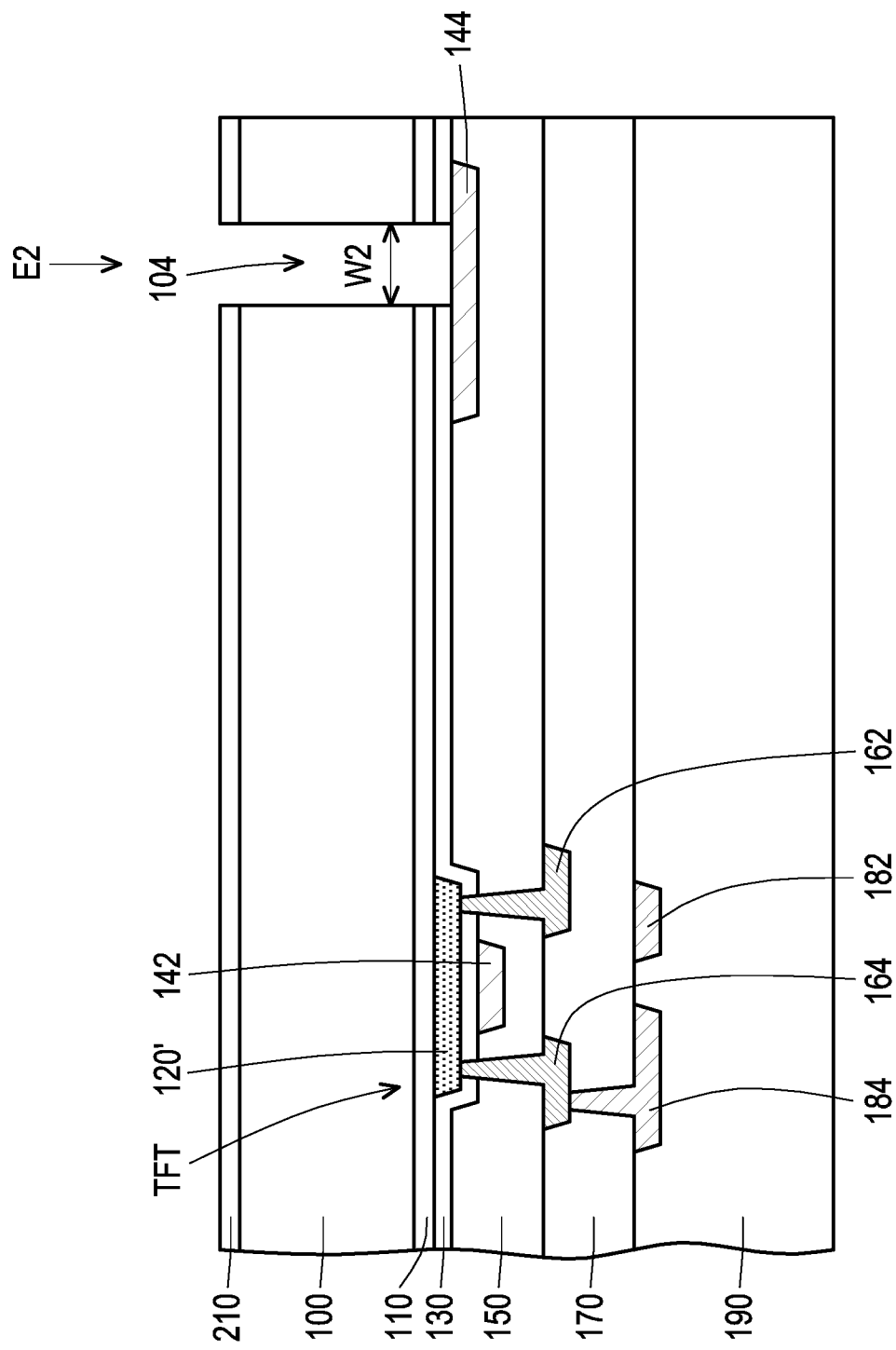

With reference to FIG. 1G, a process E2 is executed to form a through hole 104 penetrating the substrate 100 at the position of the blind hole 102. In this embodiment, the through hole 104 further penetrates the first buffer layer 110, the gate insulating layer 130, and the second buffer layer 210. In this embodiment, the process E2 stops at the first conductive pattern 144. In this embodiment, the process E2 includes laser or other physical drilling. In some embodiments, a width W2 of the through hole 104 is 100 micrometers to 300 micrometers. In this embodiment, the width W2 of the through hole 104 is greater than or equal to the width of the blind hole, but the disclosure is not limited thereto. In other embodiments, the width W2 of the through hole 104 is less than or equal to the width of the blind hole. In this embodiment, the process E2 is executed from the second surface S2 of the substrate 100.

Figure 1H:
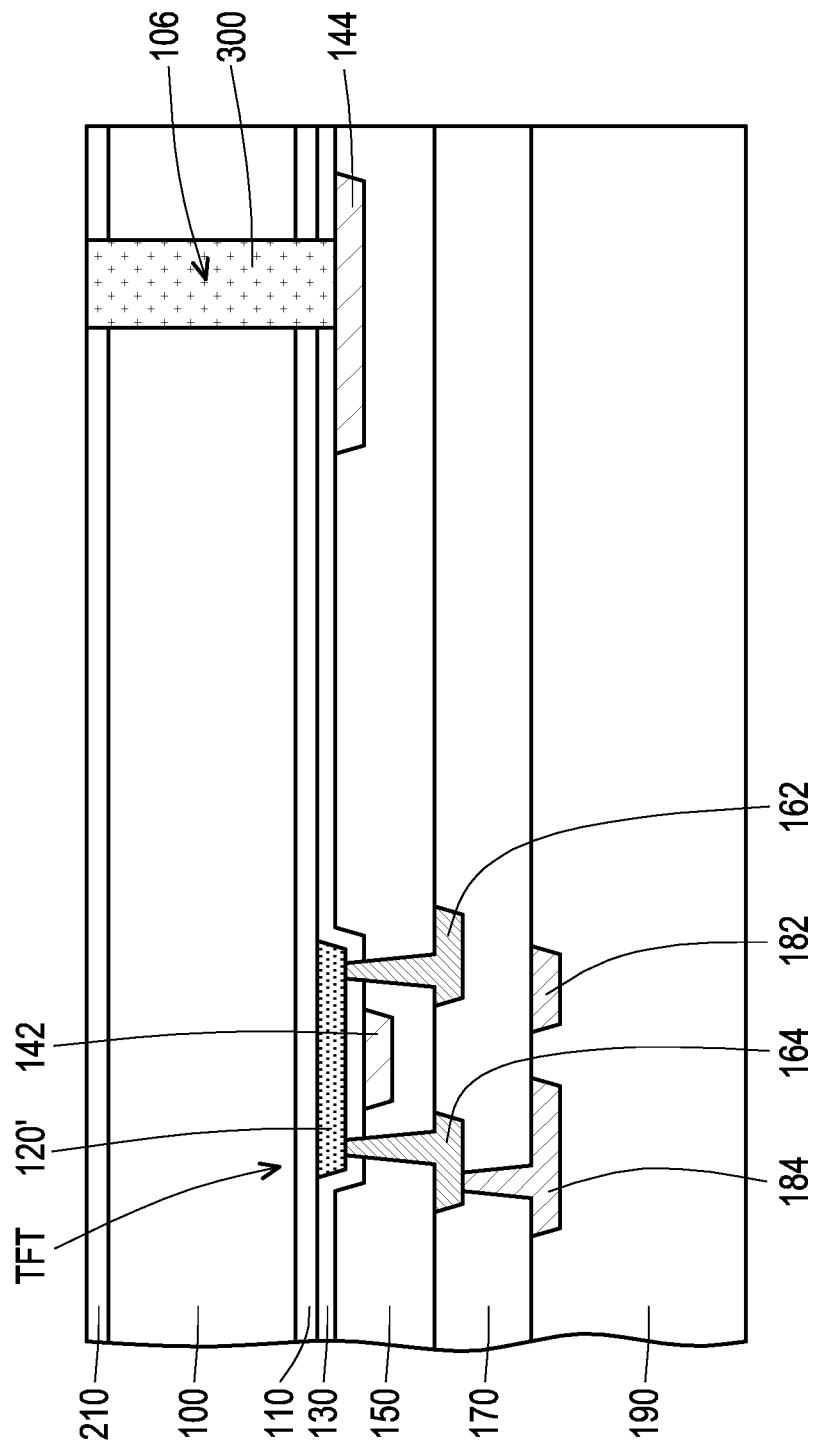

With reference to FIG. 1H, a conductive material 300 is filled into the through hole 104 to form a conductive hole 106. The conductive hole 106 is electrically connected to the first conductive pattern 144. In some embodiments, the method for filling the conductive material 300 into the through hole 104 includes electroless plating, conductive paste coating, or other suitable processes. In some embodiments, the conductive material 300 includes pure metal, alloy, or other conductive materials. In some embodiments, the conductive material 300 includes silver conductive paste, and the conductive material 300 is cured after filled into the through hole 104.

Figure 1I:
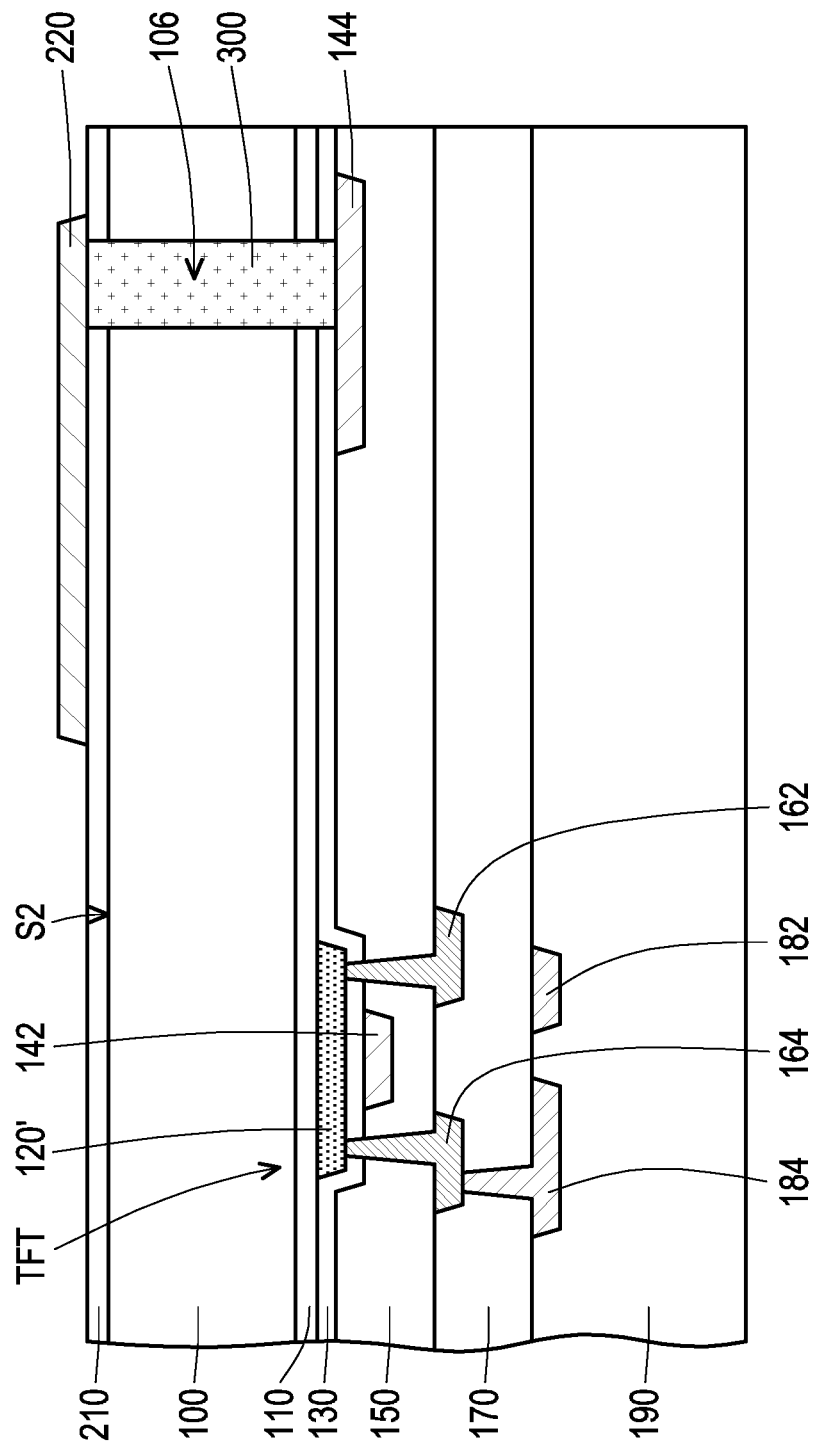

With reference to FIG. 1I, a second conductive pattern 220 is formed on the second surface S2 of the substrate 100. In this embodiment, the second conductive pattern 220 is formed on the second buffer layer 210. The second conductive pattern 220 is electrically connected to the first conductive pattern 144 through the conductive hole 106.

The second conductive pattern 220 is a monolayer or multilayer structure. In some embodiments, the second conductive pattern 220 is, for example, metals such as chromium, gold, silver, copper, tin, lead, hafnium, tungsten, molybdenum, neodymium, titanium, tantalum, aluminum, zinc, alloy of the above metals, oxide of the above metals, nitride of the above metals, a combination of the above, or other conductive materials.

Figure 1J:
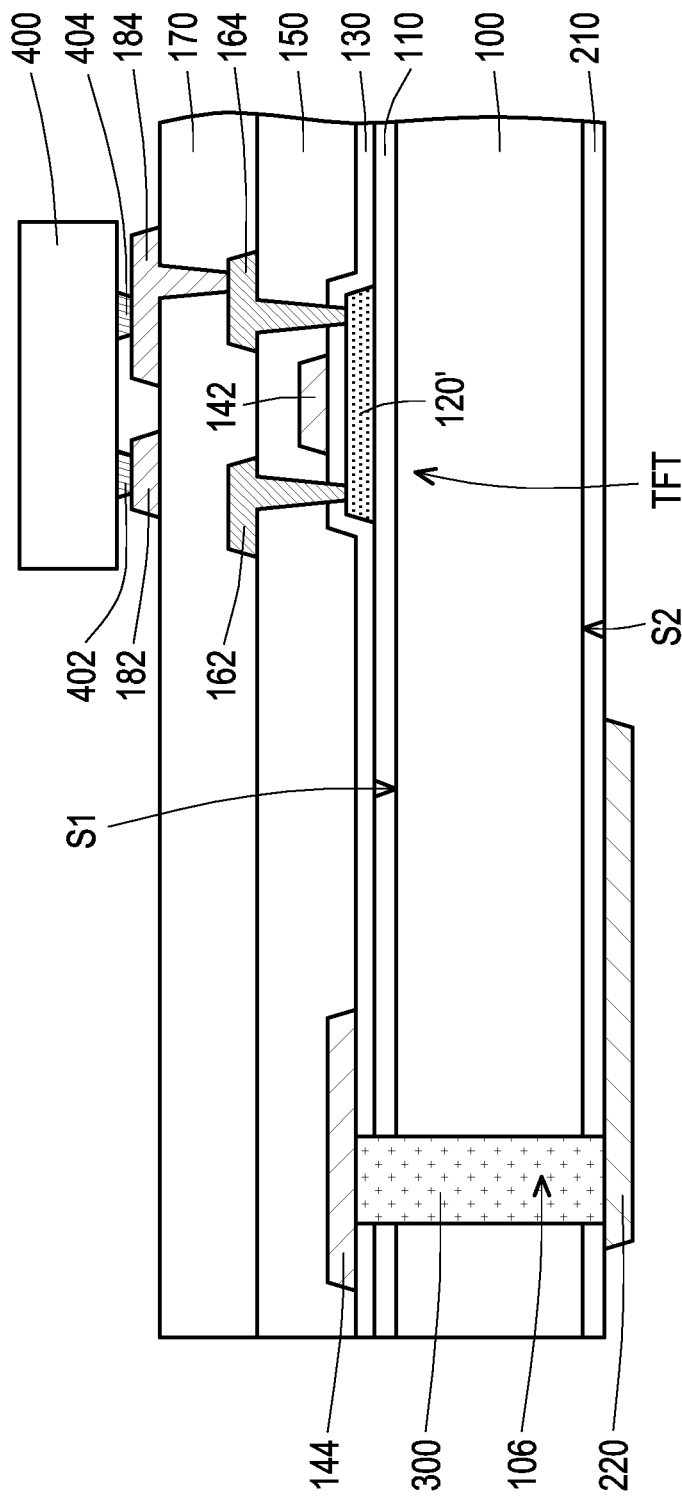

With reference to FIG. 1J, the substrate 100 is flipped over. The protection layer 190 is removed. A light-emitting diode 400 is provided on the first surface S1 of substrate 100. In this embodiment, the light-emitting diode 400 is moved from a growth substrate or an intermediate substrate to the first surface S1 of the substrate 100 by mass transfer technology. Electrodes 402 and 404 of the light-emitting diode 400 are respectively electrically connected to the first pad 182 and the second pad 184. In this embodiment, the light-emitting diode 400 is electrically connected to the drain 164 of the active device TFT. In some embodiments, the light-emitting diode 400 is a miniature light-emitting diode.

Figure 1K:
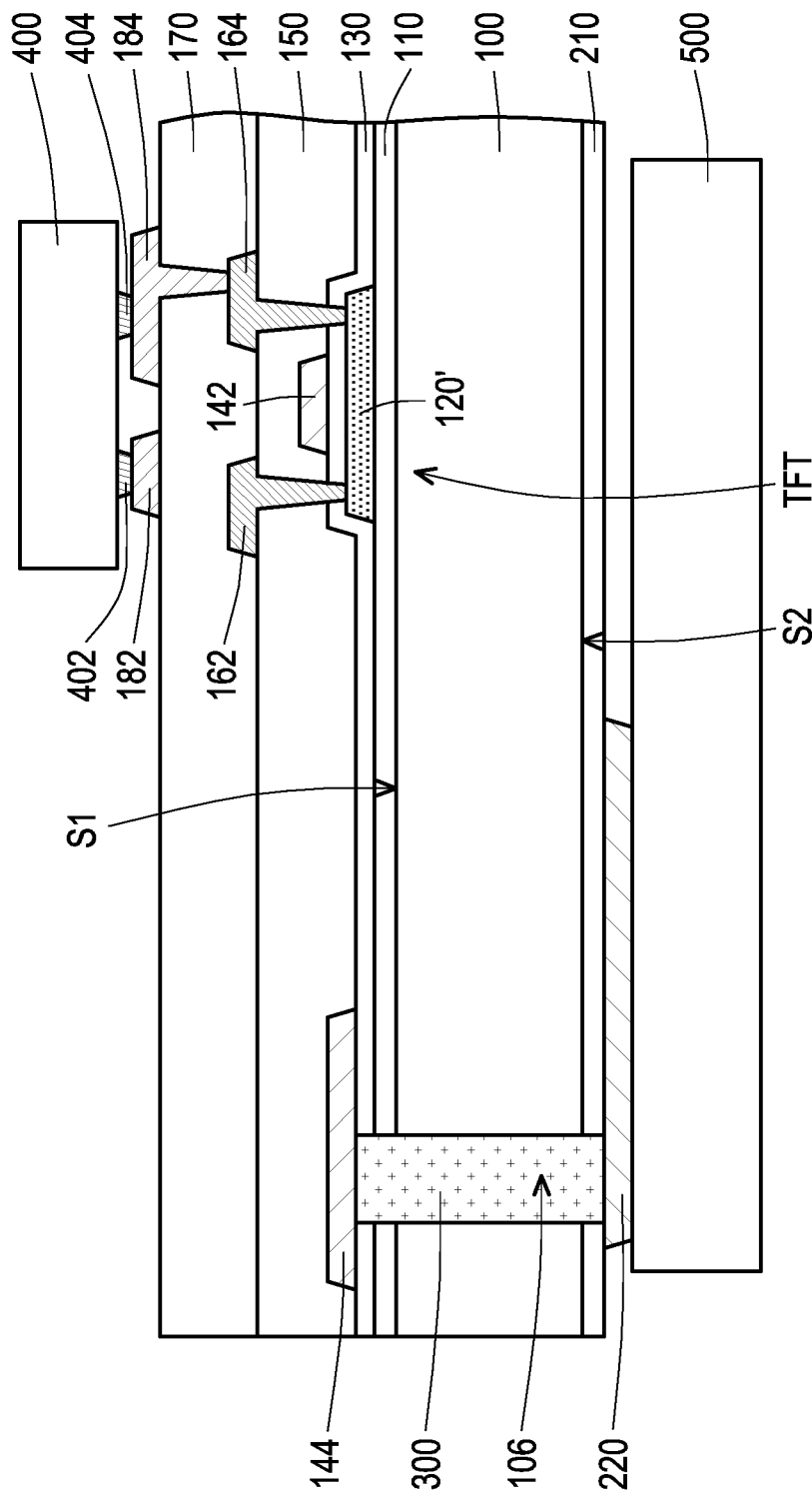

With reference to FIG. 1K, a circuit board 500 is provided on the second surface S2 of the substrate 100. The circuit board 500 is electrically connected to the second conductive pattern 220. In some embodiments, the circuit board 500 includes a chip on film package.

In some embodiments, since the circuit board 500 does not exceed the lateral surface of the substrate 100, the active device substrate may have the advantage of a narrow frame.

Figure 1L:
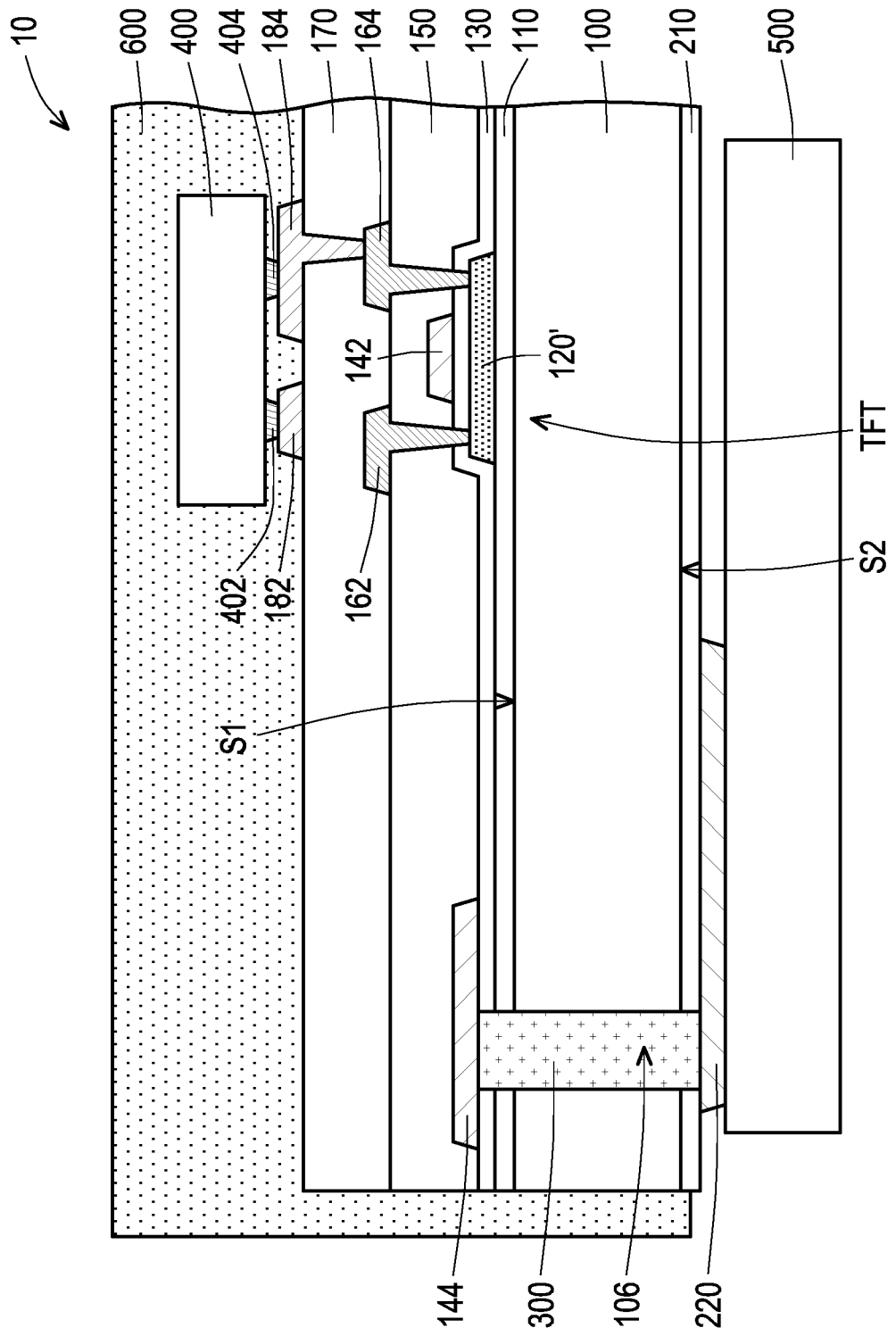

With reference to FIG. 1L, a package layer 600 is formed on the first surface S1 of the substrate 100. The package layer 600 covers the light-emitting diode 400. By this time, the active device substrate 10 is substantially completed. In this embodiment, the package layer 600 further covers the lateral surface of the substrate 100, but the disclosure is not limited thereto.

In this embodiment, the conductive hole 106 is formed after the active device TFT is formed. Therefore, the conductive hole 106 may avoid negative impacts caused by the heat treatment process forming the active device TFT. Specifically, this embodiment avoids the problem of thermal expansion of the conductive hole 106 caused by the heat treatment process for manufacturing circuits and the active device on the first surface S1 of the substrate 100, further avoiding the substrate 100 from being damaged due to the expansion of the conductive hole 106. In some embodiments, after the conductive hole 106 is formed, the temperature of the process is kept less than 300 degrees Celsius, such as 230 degrees Celsius.

Figure 2:
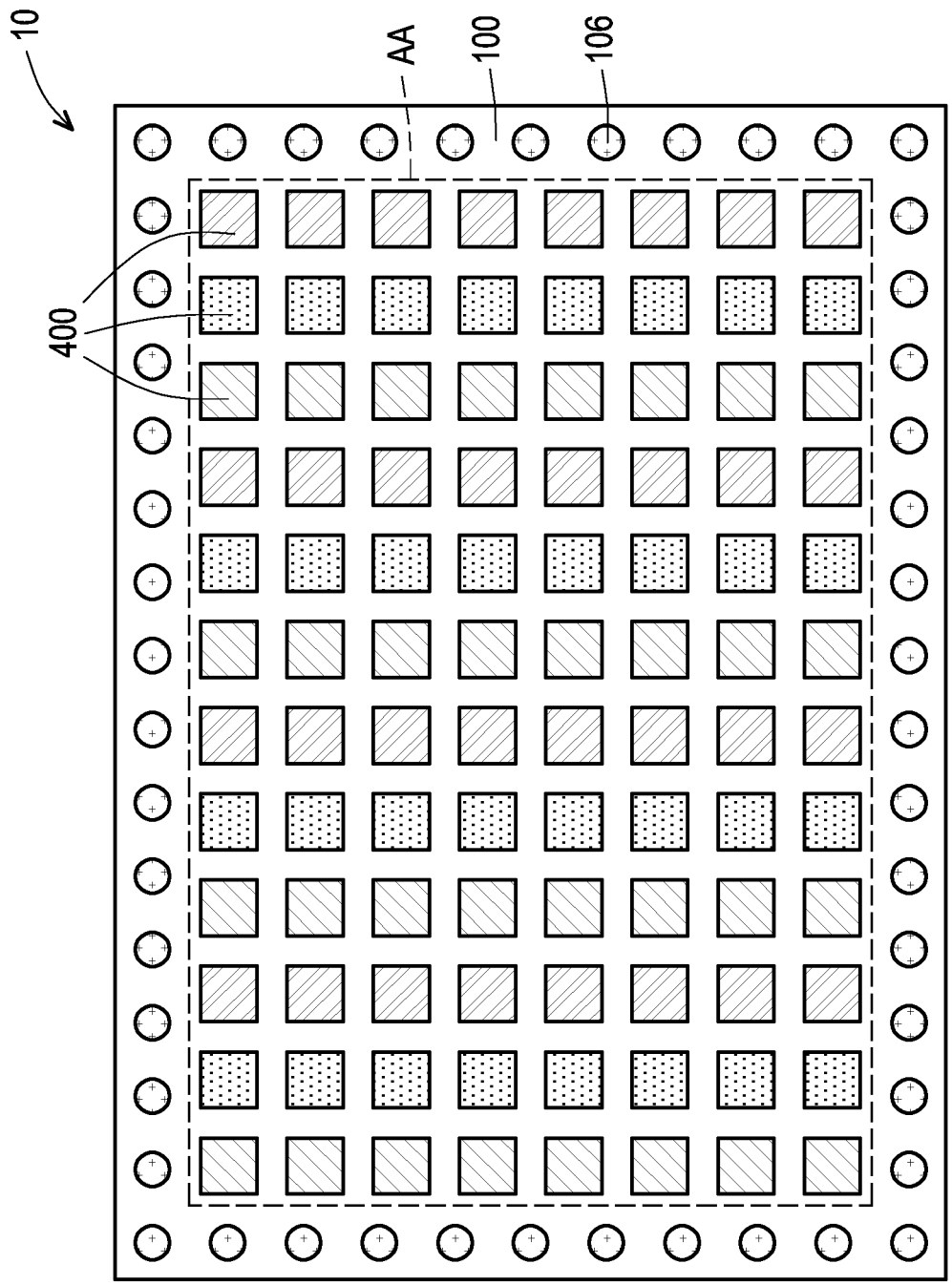
FIG. 2 is a schematic top view of an active device substrate according to an embodiment of the disclosure.

FIG. 2 is a schematic top view of an active device substrate 10 according to an embodiment of the disclosure, in which the substrate 100, the conductive hole 106, and the light-emitting diode 400 are illustrated, while other elements are omitted.

With reference to FIG. 2, in this embodiment, multiple light-emitting diodes 400 are disposed in a display area AA of the active device substrate 10. Multiple conductive holes 106 are disposed between the display area AA and the edge of the substrate 100. In some embodiments, the position of the conductive hole 106 may be adjusted according to actual needs.

FIG. 3A to FIG. 3H are schematic cross-sectional views of a manufacturing method of an active device substrate according to an embodiment of the disclosure. It should be noted here that the embodiment of FIG. 3A to FIG. 3H uses the reference numerals and part of the content of the embodiments of FIG. 1A to FIG. 2, the same reference numerals are used to denote the same or similar elements, and the description of the same technical content is omitted. For the description of the omitted part, reference may be made to the foregoing embodiment, and details are not described herein.

Figure 3A:
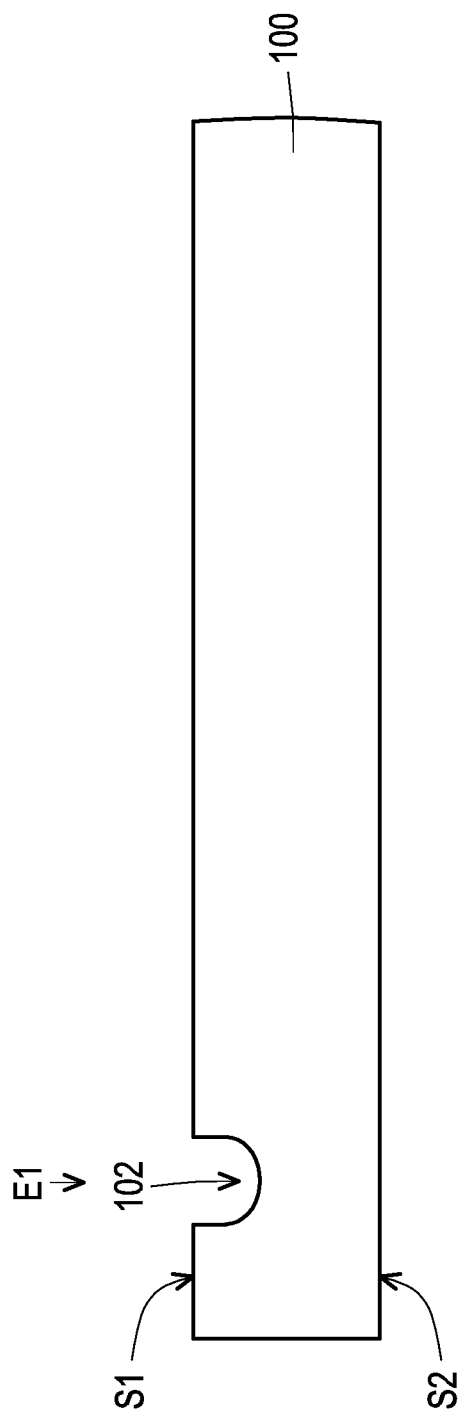

With reference to FIG. 3A, in this embodiment, the etching process E1 is executed to form the blind hole 102 on the first surface S1 of the substrate 100.

Figure 3B:
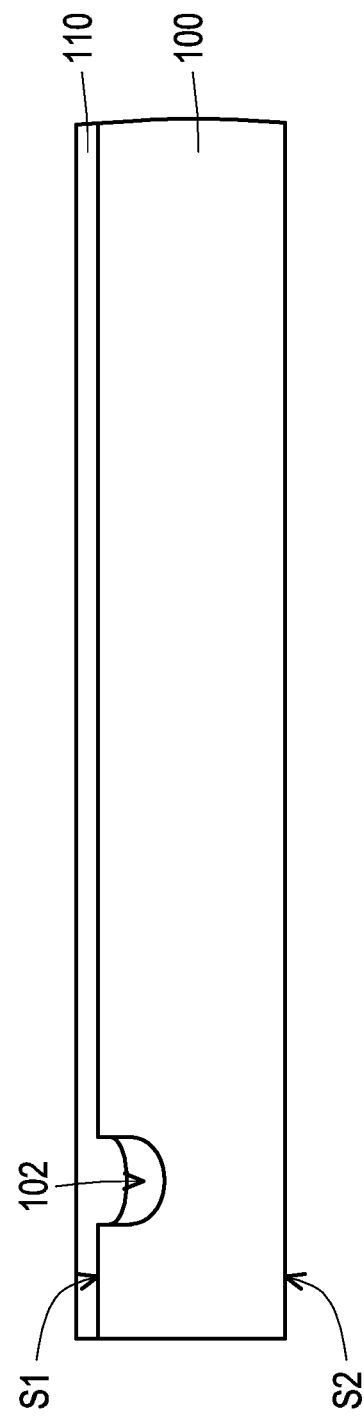

With reference to FIG. 3B, the first buffer layer 110 is formed on the first surface S1 of the substrate 100. The first buffer layer 110 covers the blind hole 102. In this embodiment, the first buffer layer 110 is partially filled into the blind hole 102, but the disclosure is not limited thereto.

Figure 3E:
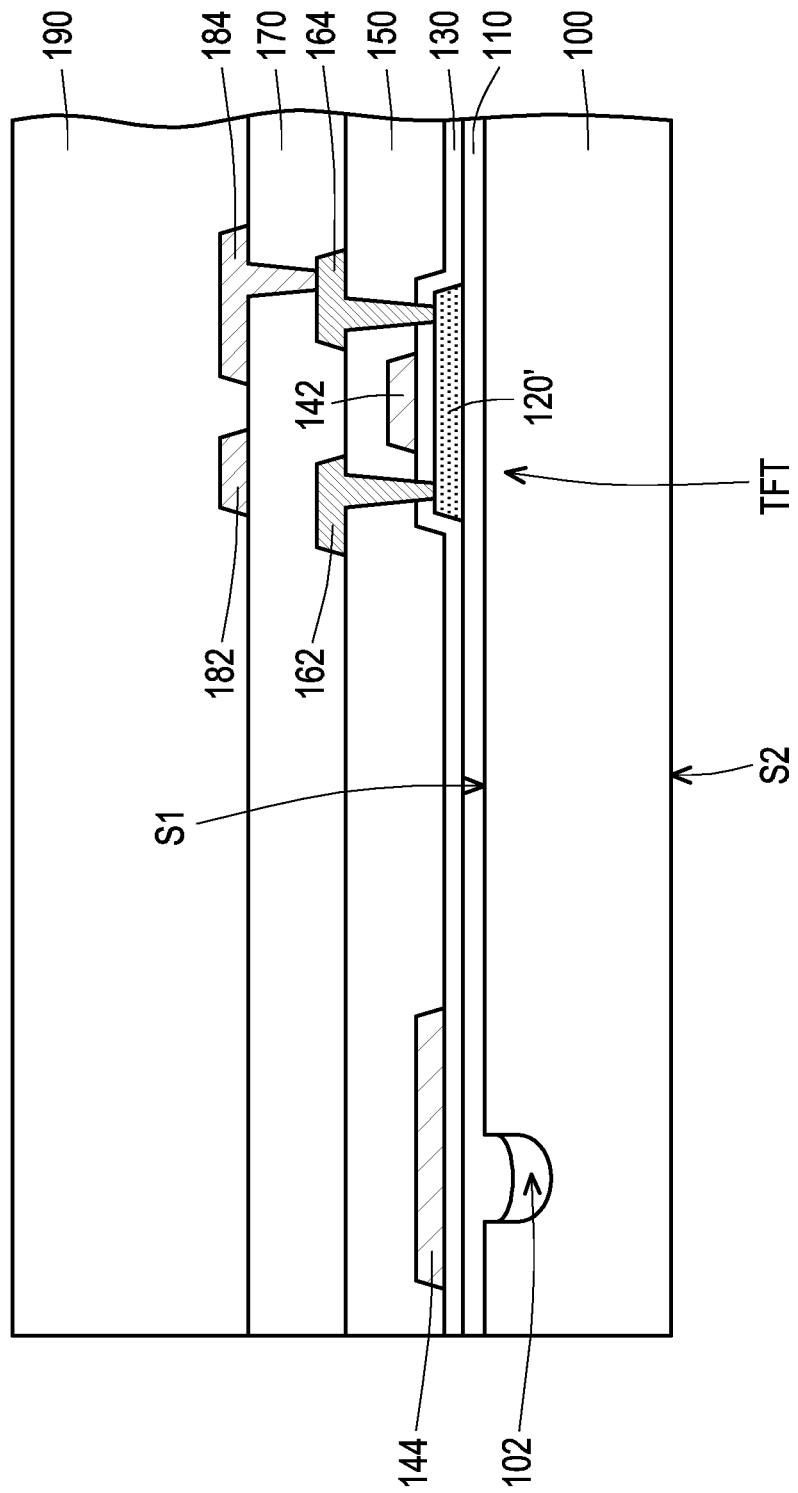

With reference to FIG. 3C to FIG. 3E, after the blind hole 102 is formed, the first conductive pattern 144 and the active device TFT are formed on the first surface S1 of the substrate 100. In this embodiment, the first conductive pattern 144 and the active device TFT are formed on the first buffer layer 110.

With reference to FIG. 3C, the semiconductor material layer 120 is formed on the first surface S1 of the substrate 100.

With reference to FIG. 3D, the semiconductor material layer 120 is patterned to form the semiconductor channel layer 120' on the first surface S1 of the substrate 100.

With reference to FIG. 3E, the gate insulating layer 130 is formed on the semiconductor channel layer 120'. In this embodiment, the gate insulating layer 130 entirely covers the first buffer layer 110 and overlaps the blind hole 102, but the disclosure is not limited thereto. In other embodiments, the gate insulating layer 130 is patterned and does not overlap the blind hole 102.

The gate 142 and the first conductive pattern 144 are formed on the gate insulating layer 130. The gate 142 overlaps the semiconductor channel layer 120'. The first conductive pattern 144 overlaps the blind hole 102.

The dielectric layer 150 is formed on the gate 142 and the first conductive pattern 144. The source 162 and the drain 164 are formed on the dielectric layer 150. The source 162 and the drain 164 are electrically connected to the semiconductor channel layer 120'. By this time, the active device TFT is substantially completed. In this embodiment, the active device TFT includes the semiconductor channel layer 120', the gate 142, the source 162, and the drain 164.

In this embodiment, the active device TFT takes a top-gate thin-film transistor as an example, but the disclosure is not limited thereto. In other embodiments, the active device TFT is a bottom-gate thin-film transistor, a dual-gate thin-film transistor, or other types of thin-film transistors.

The flatten layer 170 is formed on the active device TFT and the dielectric layer 150. The first pad 182 and the second pad 184 are formed on the flatten layer 170. In this embodiment, the second pad 184 is electrically connected to the drain 164 of the active device TFT.

The protection layer 190 is formed on the flatten layer 170, the first pad 182, and the second pad 184.

Figure 3F:
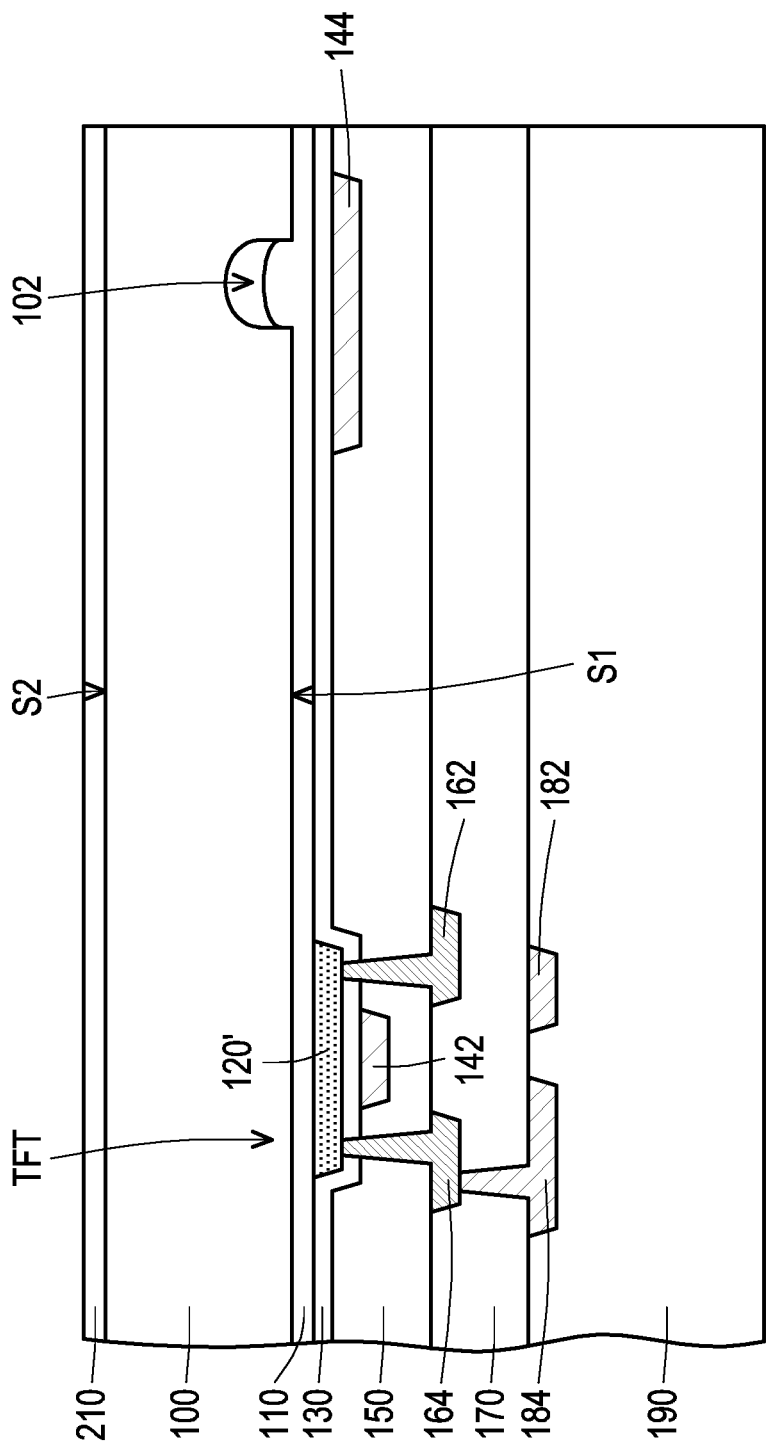

With reference to FIG. 3F, the substrate 100 is flipped over. The second buffer layer 210 is formed on the second surface S2 of the substrate 100. In this embodiment, the second buffer layer 210 overlaps the blind hole 102.

Figure 3G:
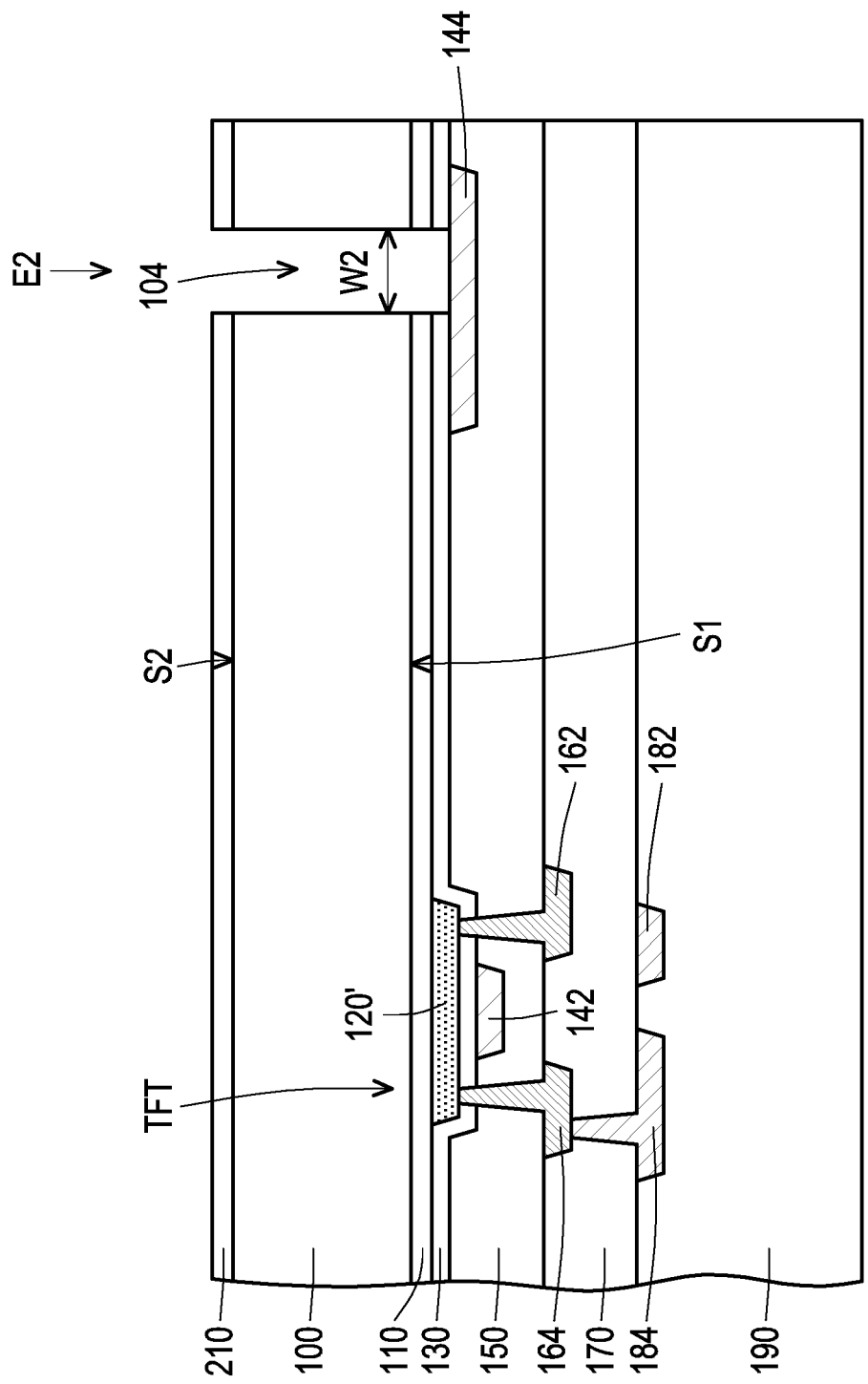

With reference to FIG. 3G, the process E2 is executed to form the through hole 104 penetrating the substrate 100 at the position of the blind hole. In this embodiment, the through hole 104 further penetrates the first buffer layer 110, the gate insulating layer 130, and the second buffer layer 210. In this embodiment, the process E2 stops at the first conductive pattern 144. In this embodiment, the process E2 includes laser or other physical drilling. In this embodiment, the process E2 is executed from the second surface S2 of the substrate 100.

In this embodiment, the width W2 of the through hole 104 is greater than or equal to the width of the blind hole, but the disclosure is not limited thereto. In other embodiments, the width W2 of the through hole 104 is less than or equal to the width of the blind hole.

Figure 3H:
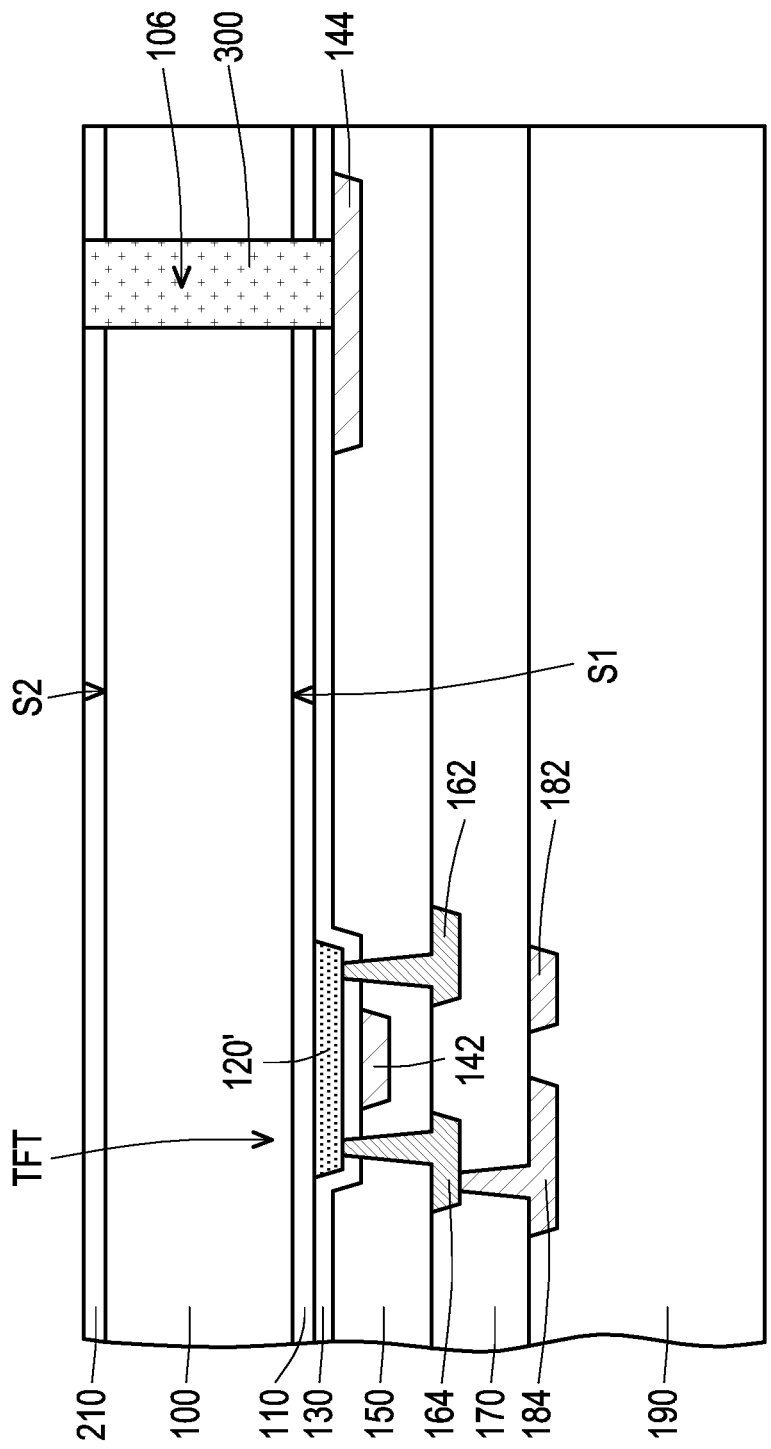

With reference to FIG. 3H, the conductive material 300 is filled into the through hole 104 to form the conductive hole 106. The conductive hole 106 is electrically connected to the first conductive pattern 144. In some embodiments, the method for filling the conductive material 300 into the through hole 104 includes electroless plating, conductive paste coating, or other suitable processes. In some embodiments, the conductive material 300 includes pure metal, alloy, or other conductive materials. In some embodiments, the conductive material 300 includes silver conductive paste, and the conductive material 300 is cured after filled into the through hole 104.

After the steps in FIG. 3H, the steps in FIG. 1I to FIG. 1L are executed, and reference may be made to the previous paragraphs for related description.

Figure 4:
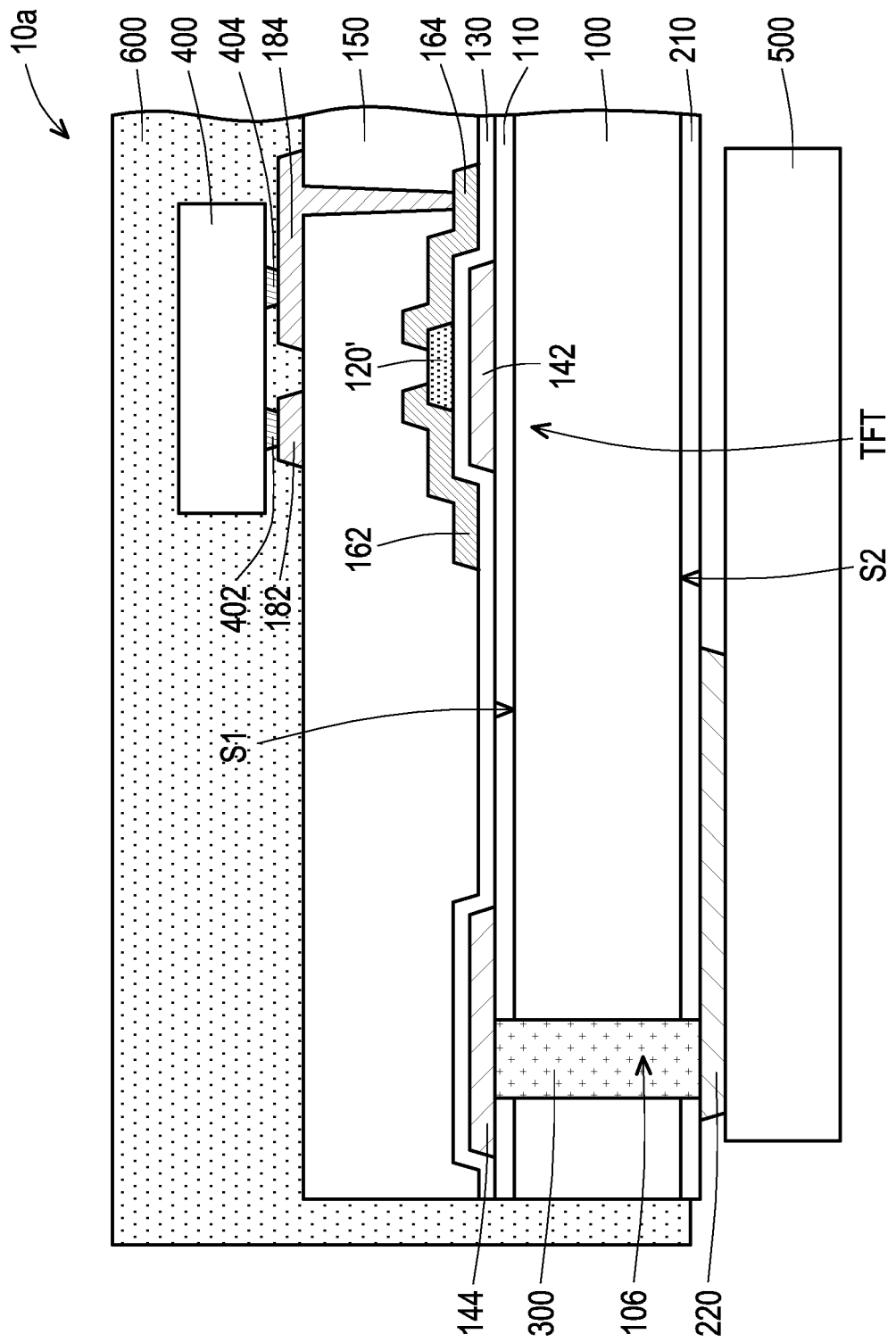
FIG. 4 is a schematic cross-sectional view of an active device substrate according to an embodiment of the disclosure.

FIG. 4 is a schematic cross-sectional view of an active device substrate according to an embodiment of the disclosure. It should be noted here that the embodiment of FIG. 4 uses the reference numerals and part of the content of the embodiments of FIG. 1A to FIG. 2, the same reference numerals are used to denote the same or similar elements, and the description of the same technical content is omitted. For the description of the omitted part, reference may be made to the foregoing embodiment, and details are not described herein.

The main difference between an active device substrate 10a of FIG. 4 and the active device substrate 10 of FIG. 1L is that: the active device TFT of the active device substrate 10a is a bottom-gate thin-film transistor, but the disclosure is not limited thereto. In other embodiments, the active device TFT is a top-gate thin-film transistor.

With reference to FIG. 4, in this embodiment, the first conductive pattern 144 and the gate 142 are formed on the first surface S1 of the substrate 100. In this embodiment, the first conductive pattern 144 and the gate 142 are formed on the first buffer layer 110.

The gate insulating layer 130 is formed on the gate 142 and the first conductive pattern 144. The gate 142 and the first conductive pattern 144 are located between the gate insulating layer 130 and the first buffer layer 110.

The semiconductor channel layer 120' is formed on the gate insulating layer 130. The semiconductor channel layer 120' overlaps the gate 142.

The source 162 and the drain 164 are formed on the semiconductor channel layer 120'.

The dielectric layer 150 is formed on the source 162 and the drain 164.

The first pad 182 and the second pad 184 are formed on the dielectric layer 150. The light-emitting diode 400 is electrically connected to the first pad 182 and the second pad 184.

The package layer 600 is formed on the first surface S1 of the substrate 100. The package layer 600 covers the light-emitting diode 400.

In this embodiment, the conductive hole 106 penetrates the substrate 100, the first buffer layer 110, and the second buffer layer 210.

Figure 5:
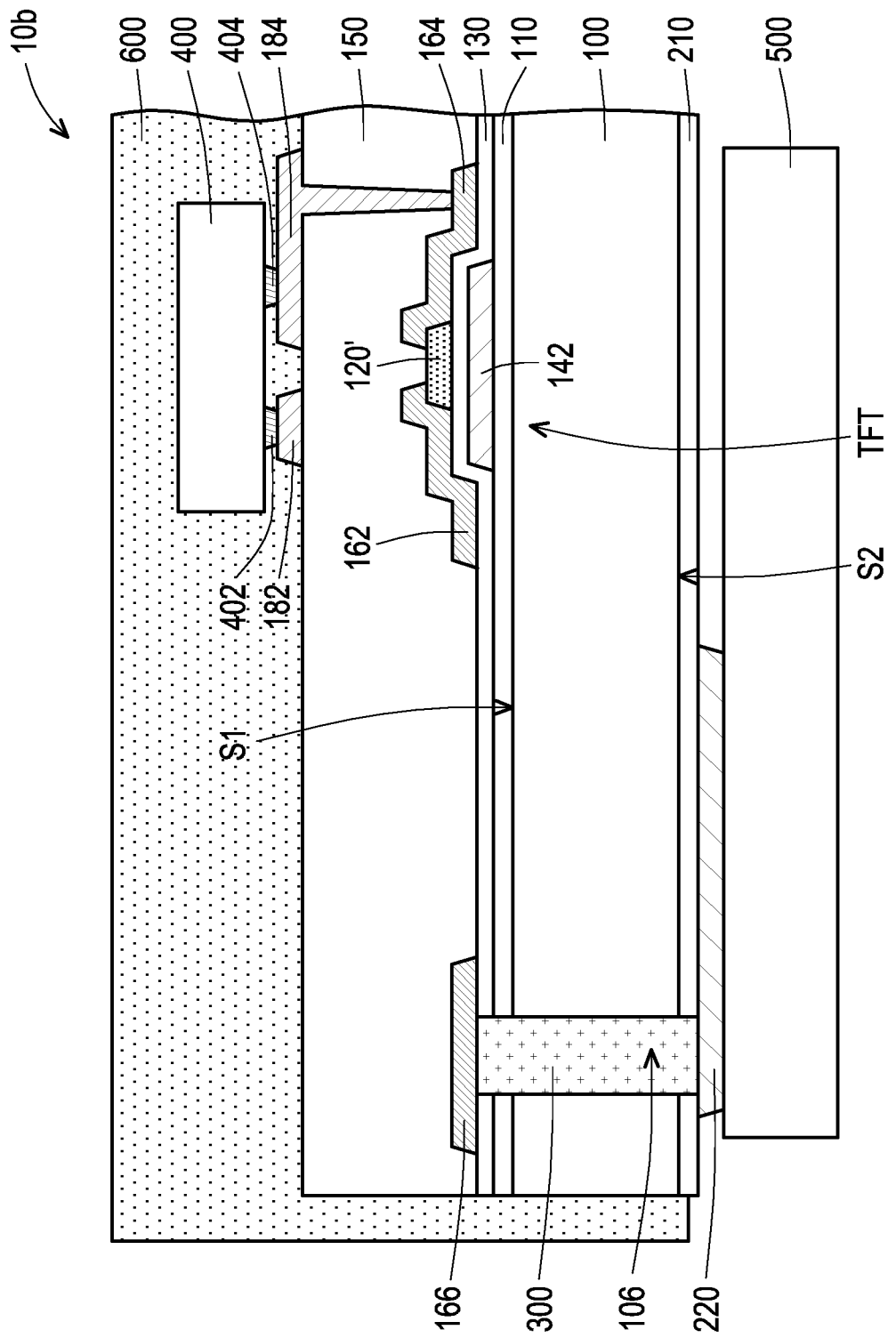
FIG. 5 is a schematic cross-sectional view of an active device substrate according to an embodiment of the disclosure.

FIG. 5 is a schematic cross-sectional view of an active device substrate according to an embodiment of the disclosure. It should be noted here that the embodiment of FIG. 5 uses the reference numerals and part of the content of the embodiment of FIG. 4, the same reference numerals are used to denote the same or similar elements, and the description of the same technical content is omitted. For the description of the omitted part, reference may be made to the foregoing embodiment, and details are not described herein.

The main difference between an active device substrate 10b of FIG. 5 and the active device substrate 10a of FIG. 4 is that: the first conductive pattern 144 and the gate 142 of the active device substrate 10a of FIG. 4 belong to the same film layer, and the first conductive pattern 166, the source 162, and the drain 164 of the active device substrate 10b of FIG. 5 belong to the same film layer.

In this embodiment, the conductive hole 106 penetrates the substrate 100, the first buffer layer 110, the second buffer layer 210, and the gate insulating layer 130.

Figure 6:
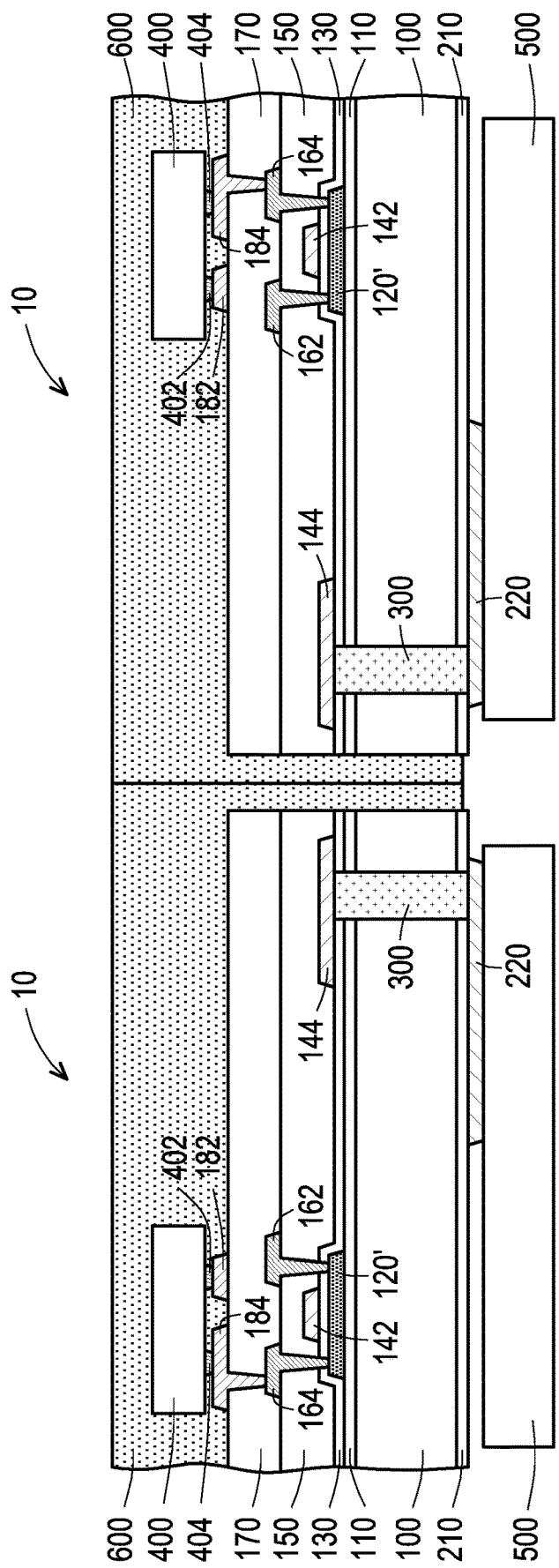
FIG. 6 is a schematic cross-sectional view of a spliced display apparatus according to an embodiment of the disclosure.

FIG. 6 is a schematic cross-sectional view of a spliced display apparatus according to an embodiment of the disclosure. It should be noted here that the embodiment of FIG. 6 uses the reference numerals and part of the content of the embodiments of FIG. 1L to FIG. 2, the same reference numerals are used to denote the same or similar elements, and the description of the same technical content is omitted. For the description of the omitted part, reference may be made to the foregoing embodiment, and details are not described herein.

With reference to FIG. 6, in this embodiment, multiple active device substrates 10 are spliced together. Since the circuit board 500 is not disposed on the lateral surface of the substrate 100, the spacing between the adjacent active device substrates 10 may be reduced.

Figure 7:
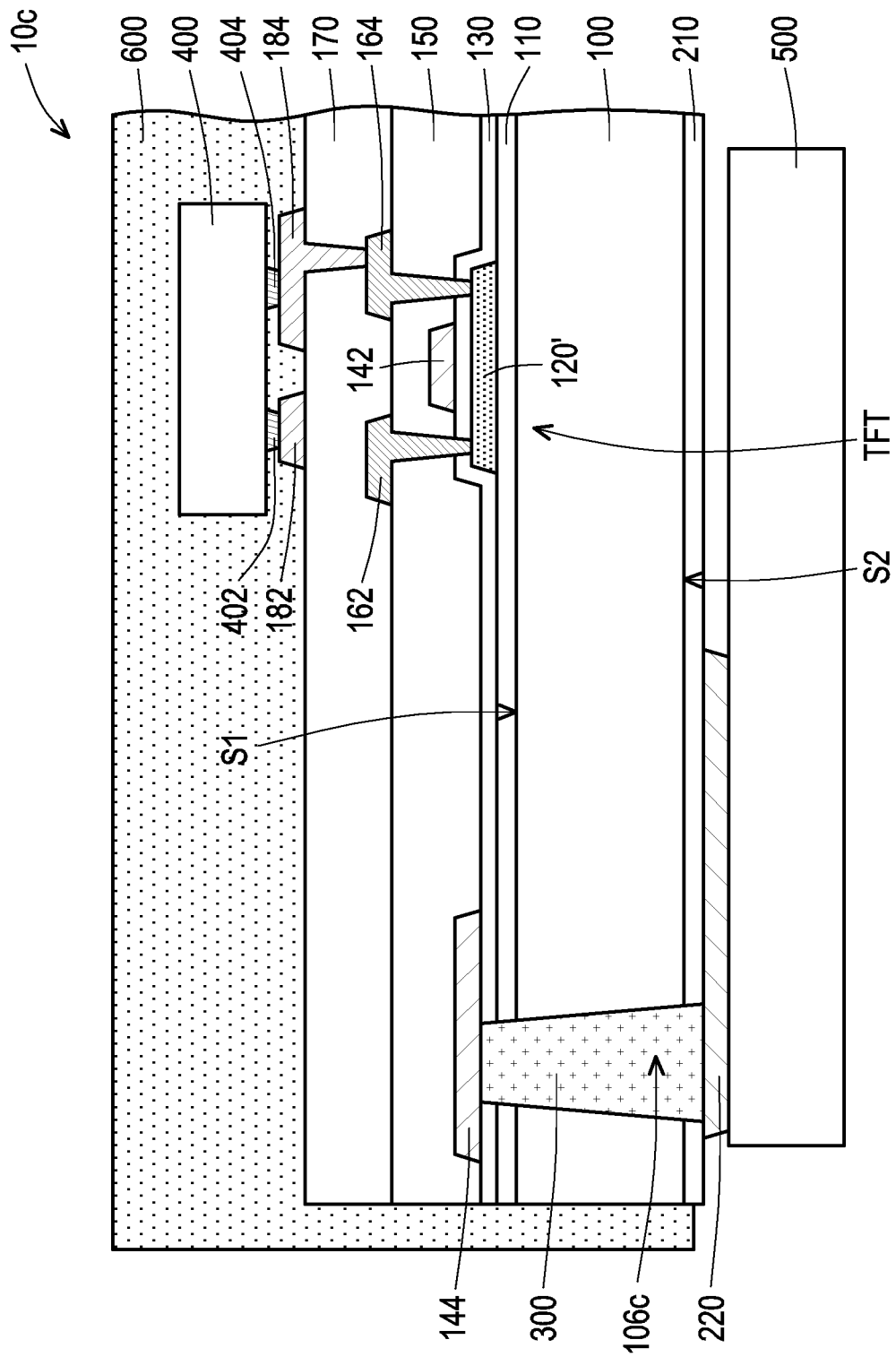
FIG. 7 is a schematic cross-sectional view of an active device substrate according to an embodiment of the disclosure.

FIG. 7 is a schematic cross-sectional view of an active device substrate according to an embodiment of the disclosure. It should be noted here that the embodiment of FIG. 7 uses the reference numerals and part of the content of the embodiments of FIG. 1L to FIG. 2, the same reference numerals are used to denote the same or similar elements, and the description of the same technical content is omitted. For the description of the omitted part, reference may be made to the foregoing embodiment, and details are not described herein.

The difference between an active device substrate 10c of FIG. 7 and the active device substrate 10 of FIG. 1L is that: a conductive hole 106c of the active device substrate 10c has a cross-sectional shape with a narrow top and a broad bottom. For example, the conductive hole 106c is conical, and the cross-sectional shape of the conductive hole 106c is trapezoid.

In this embodiment, the process of forming the blind hole 102 (as shown in FIG. 1A) and the process E2 (as shown in FIG. 1G) are executed from the same side of the substrate 100 (such as from the second surface S2), and the width of the conductive hole 106c near the first conductive pattern 144 is less than the width of the conductive hole 106c near the second conductive pattern 220. In other words, the conductive hole 106c has different widths.

Figure 8:
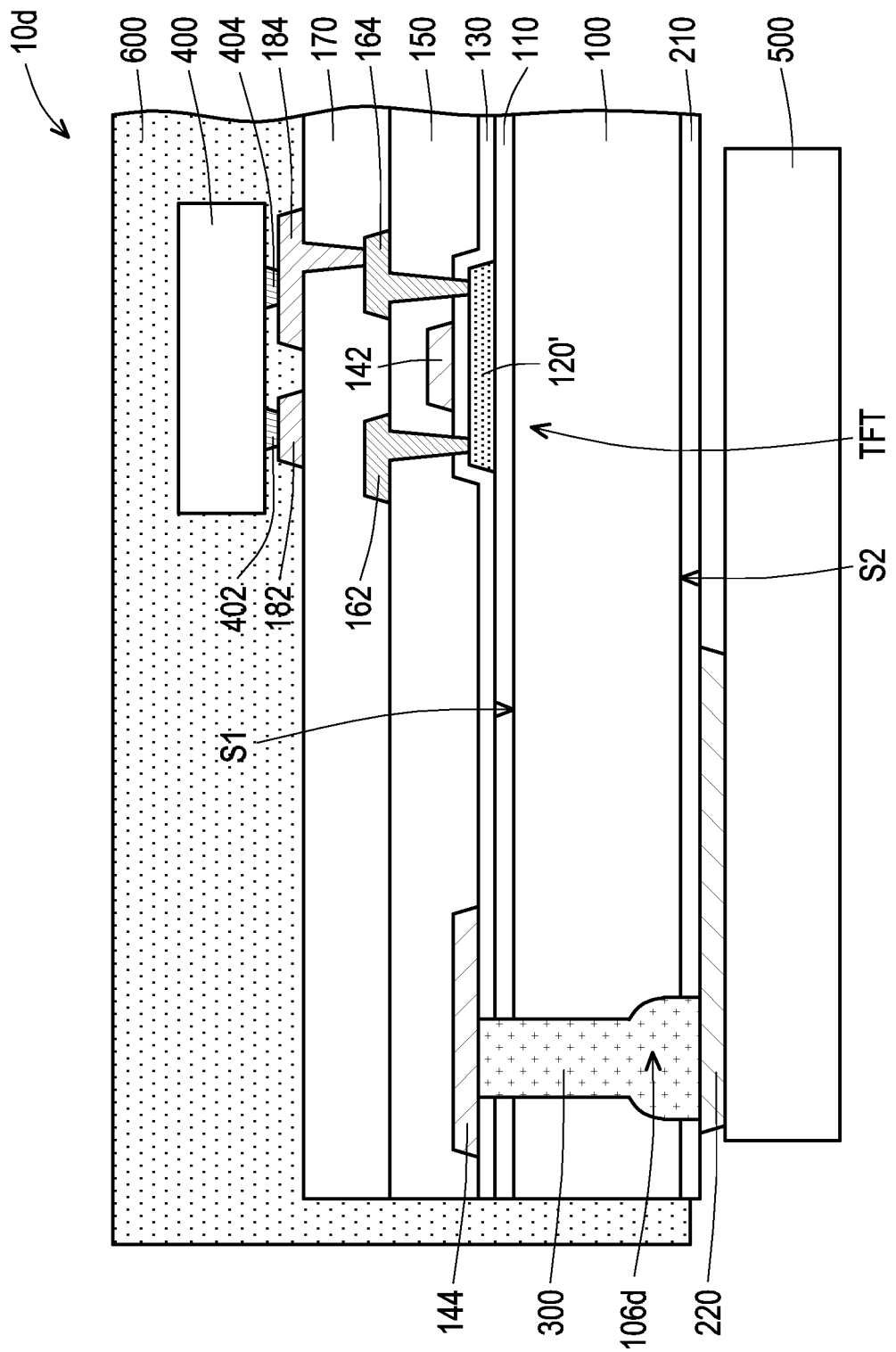
FIG. 8 is a schematic cross-sectional view of an active device substrate according to an embodiment of the disclosure.

FIG. 8 is a schematic cross-sectional view of an active device substrate according to an embodiment of the disclosure. It should be noted here that the embodiment of FIG. 8 uses the reference numerals and part of the content of the embodiment of FIG. 7, the same reference numerals are used to denote the same or similar elements, and the description of the same technical content is omitted. For the description of the omitted part, reference may be made to the foregoing embodiment, and details are not described herein.

The difference between an active device substrate 10d of FIG. 8 and the active device substrate 10c of FIG. 7 is that: the width of a conductive hole 106d of the active device substrate 10d does not change in a gradual manner.

In this embodiment, the process of forming the blind hole 102 (as shown in FIG. 1A) and the process E2 (as shown in FIG. 1G) are executed from the same side of the substrate 100 (such as from the second surface S2), and the width of the conductive hole 106d near the first conductive pattern 144 is less than the width of the conductive hole 106d near the second conductive pattern 220. In other words, the conductive hole 106d has different widths.

Figure 9:
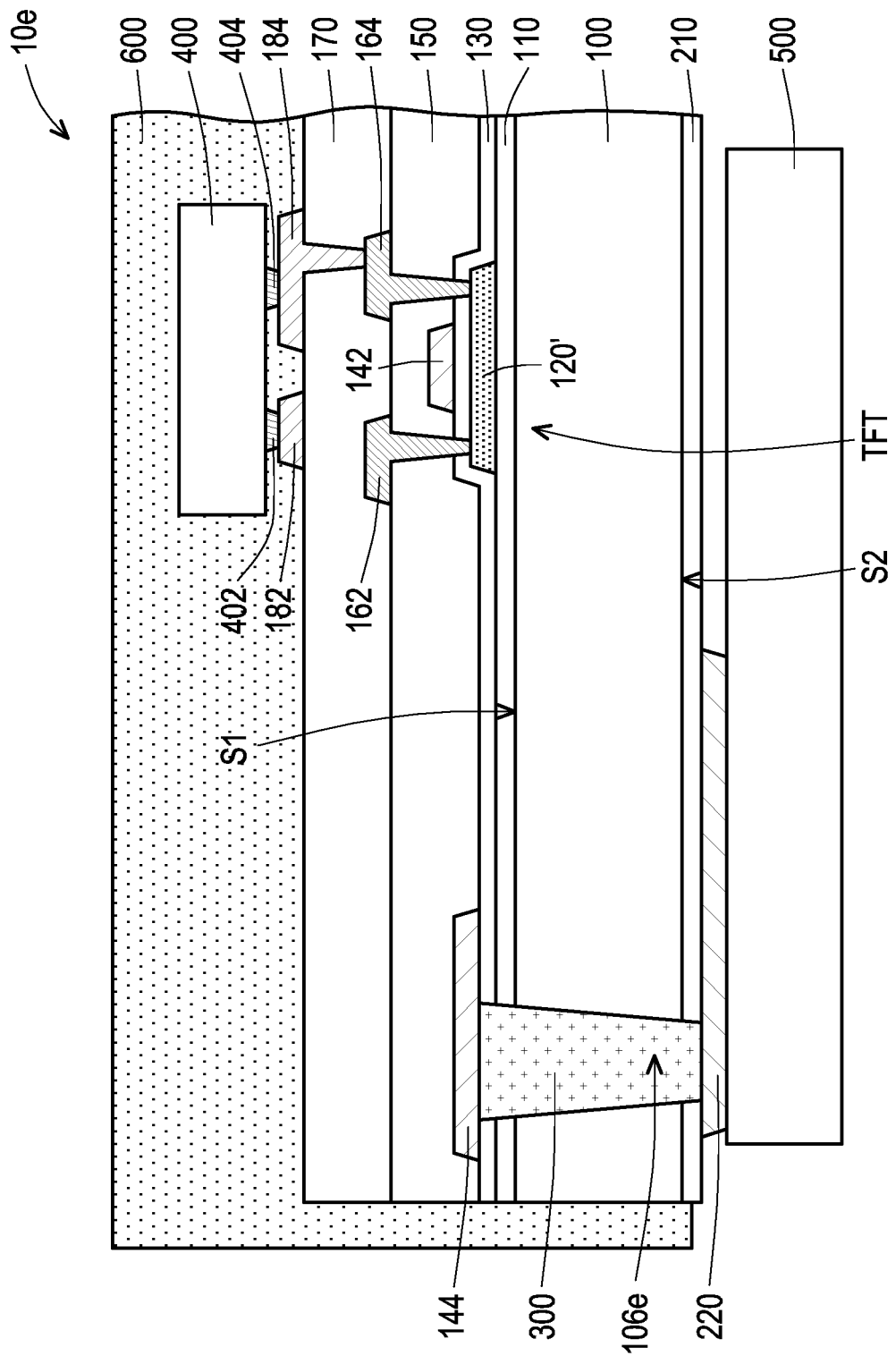
FIG. 9 is a schematic cross-sectional view of an active device substrate according to an embodiment of the disclosure.

FIG. 9 is a schematic cross-sectional view of an active device substrate according to an embodiment of the disclosure. It should be noted here that the embodiment of FIG. 9 uses the reference numerals and part of the content of the embodiments of FIG. 3A to FIG. 3H and FIG. 1I to FIG. 1L, the same reference numerals are used to denote the same or similar elements, and the description of the same technical content is omitted. For the description of the omitted part, reference may be made to the foregoing embodiment, and details are not described herein.

The difference between an active device substrate 10e of FIG. 9 and the active device substrate 10 of FIG. 1L is that: a conductive hole 106e of the active device substrate 10e has a cross-sectional shape with a narrow bottom and a broad top. For example, the conductive hole 106e is conical, and the cross-sectional shape of the conductive hole 106e is trapezoid.

In this embodiment, the process of forming the blind hole 102 (as shown in FIG. 3A) and the process E2 (as shown in FIG. 3G) are executed from different sides of the substrate 100 (such as the process of forming the blind hole 102 from the first surface S1, and the process E2 from the second surface S2), and the width of the conductive hole 106e near the first conductive pattern 144 is greater than the width of the conductive hole 106e near the second conductive pattern 220. In other words, the conductive hole 106e has different widths.

Figure 10:
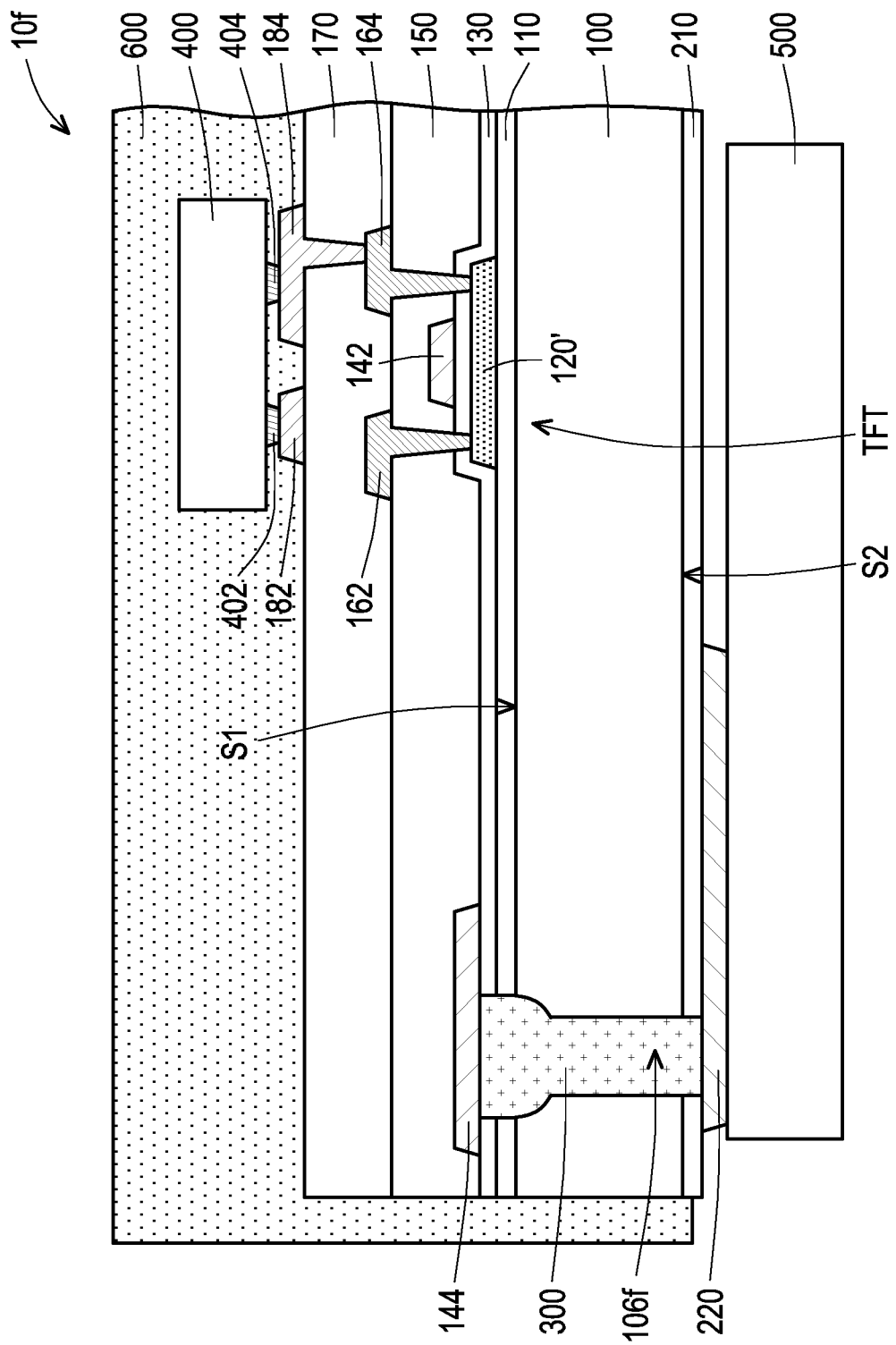
FIG. 10 is a schematic cross-sectional view of an active device substrate according to an embodiment of the disclosure.

FIG. 10 is a schematic cross-sectional view of an active device substrate according to an embodiment of the disclosure. It should be noted here that the embodiment of FIG. 10 uses the reference numerals and part of the content of the embodiment of FIG. 9, the same reference numerals are used to denote the same or similar elements, and the description of the same technical content is omitted. For the description of the omitted part, reference may be made to the foregoing embodiment, and details are not described herein.

The difference between an active device substrate 10f of FIG. 10 and the active device substrate 10e of FIG. 9 is that: the width of a conductive hole 106f of the active device substrate 10f does not change in a gradual manner.

In this embodiment, the process of forming the blind hole 102 (as shown in FIG. 3A) and the process E2 (as shown in FIG. 3G) are executed from different sides of the substrate 100 (such as the process of forming the blind hole 102 from the first surface S1, and the process E2 from the second surface S2), and the width of the conductive hole 106f near the first conductive pattern 144 is greater than the width of the conductive hole 106f near the second conductive pattern 220. In other words, the conductive hole 106f has different widths.

What is claimed is:

1. A manufacturing method of an active device substrate, comprising:
    forming a blind hole in a substrate, wherein the blind hole does not penetrate the substrate, wherein a portion of the substrate stops at an end of the blind hole;
    after a step of forming the blind hole, forming a first buffer layer, a first conductive pattern and an active device on a first surface of the substrate, wherein the first buffer layer and the first conductive pattern overlap the blind hole;
    after forming the first buffer layer, the first conductive pattern and the active device, executing an etching process on the substrate to remove the portion of the substrate and a portion of the first buffer layer and then form a through hole penetrating the substrate at a position of the blind hole, so that at least a portion of the first conductive pattern is exposed by the through hole;
    filling a conductive material into the through hole to form a conductive hole, wherein the conductive hole is electrically connected to the first conductive pattern; and
    forming a second conductive pattern on a second surface of the substrate, wherein the second conductive pattern is electrically connected to the first conductive pattern through the conductive hole.

2. The manufacturing method according to claim 1, further comprising:
    forming the blind hole on the second surface of the substrate; and
    forming the first conductive pattern and the active device on the first buffer layer.

3. The manufacturing method according to claim 2, further comprising:
    forming a second buffer layer on the second surface of the substrate, wherein the second buffer layer covers the blind hole; and
    executing the etching process to form the through hole penetrating the substrate, the first buffer layer, and the second buffer layer at the position of the blind hole.

4. The manufacturing method according to claim 1, further comprising:
    forming the blind hole on the first surface of the substrate; and
    forming the first conductive pattern and the active device on the first buffer layer.

5. The manufacturing method according to claim 4, further comprising:
    forming a second buffer layer on the second surface of the substrate; and
    executing the etching process to form the through hole penetrating the substrate, the first buffer layer, and the second buffer layer at the position of the blind hole.

6. The manufacturing method according to claim 1, further comprising:
    providing a circuit board on the second surface of the substrate, the circuit board electrically connected to the second conductive pattern; and
    providing a light-emitting diode on the first surface of the substrate.

7. The manufacturing method according to claim 1, wherein a method for forming the blind hole on the substrate comprises laser, and the etching process comprises laser etching.

8. The manufacturing method according to claim 1, wherein the conductive hole has different widths.

9. The manufacturing method according to claim 1, wherein forming the first conductive pattern and the active device on the first surface of the substrate comprises:
    forming a semiconductor channel layer on the first surface of the substrate;
    forming a gate insulating layer on the semiconductor channel layer;
    forming a gate and the first conductive pattern on the gate insulating layer, wherein the gate overlaps the semiconductor channel layer;
    forming a dielectric layer on the gate and the first conductive pattern; and
    forming a source and a drain electrically connected to the semiconductor channel layer on the dielectric layer.

10. The manufacturing method according to claim 9, wherein the etching process is executed to form the through hole penetrating the substrate and the gate insulating layer at the position of the blind hole.

11. The manufacturing method according to claim 9, wherein a process for forming the active device comprises a process in a temperature of 200 degrees Celsius to 600 degrees Celsius.

12. The manufacturing method according to claim 1, wherein forming the first conductive pattern and the active device on the first surface of the substrate comprises:

forming the first conductive pattern and a gate on the first surface of the substrate;
forming a semiconductor channel layer;
forming a gate insulating layer between the gate and the semiconductor layer, wherein the semiconductor channel layer overlaps the gate; and
forming a source and a drain on the semiconductor channel layer.

13. The manufacturing method according to claim 1, wherein the etching process stops at the first conductive pattern.

14. The manufacturing method according to claim 1, wherein after the blind hole is formed, the first conductive pattern and the active device are formed on the first surface of the substrate.

15. A manufacturing method of an active device substrate, comprising:
forming a blind hole in a substrate and on a first surface of the substrate;
forming a first buffer layer on the first surface of the substrate, wherein a portion of the first buffer layer covers the blind hole, and at least a portion of the blind hole is filled by the portion of the first buffer layer;
forming a first conductive pattern and an active device above the first buffer layer on the first surface of the substrate, wherein the first conductive pattern overlaps the blind hole, wherein a portion of the substrate is between a bottom surface of the blind hole and a second surface of the substrate;
after forming the first conductive pattern and the active device, executing an etching process on the substrate to remove the portion of the substrate and the portion of the first buffer layer to form a through hole penetrating the substrate and the first buffer layer at a position of the blind hole;
filling a conductive material into the through hole to form a conductive hole, wherein the conductive hole is electrically connected to the first conductive pattern; and
forming a second conductive pattern above the second surface of the substrate, wherein the second conductive pattern is electrically connected to the first conductive pattern through the conductive hole.

16. A manufacturing method of an active device substrate, comprising:
forming a blind hole in a substrate and on a second surface of the substrate;
forming a second buffer layer on the second surface of the substrate, wherein the second buffer layer covers the blind hole;
forming a first buffer layer on a first surface of the substrate, wherein the first buffer layer overlaps the blind hole;
forming a first conductive pattern and an active device above the first buffer layer on the first surface of the substrate, wherein the first conductive pattern overlaps the blind hole, wherein a portion of the substrate and a portion of the first buffer layer are between a bottom surface of the blind hole and the first conductive pattern;
after forming the first conductive pattern and the active device, executing an etching process on the substrate to remove the portion of the substrate, the portion of the first buffer layer and a portion of the second buffer layer to form a through hole penetrating the substrate, the first buffer layer and the second buffer layer at a position of the blind hole;
filling a conductive material into the through hole to form a conductive hole, wherein the conductive hole is electrically connected to the first conductive pattern; and
forming a second conductive pattern above the second surface of the substrate, wherein the second conductive pattern is electrically connected to the first conductive pattern through the conductive hole.

* * * * *